United States Patent
Kodama et al.

(10) Patent No.: US 7,073,142 B2
(45) Date of Patent: Jul. 4, 2006

(54) WIRING DIAGRAM VERIFYING METHOD, PROGRAM, AND APPARATUS

(75) Inventors: Chikaaki Kodama, Kasukabe (JP); Akihiro Yoshitake, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 264 days.

(21) Appl. No.: 10/752,701

(22) Filed: Jan. 8, 2004

(65) Prior Publication Data
US 2004/0143806 A1 Jul. 22, 2004

(30) Foreign Application Priority Data
Jan. 10, 2003 (JP) ............................. 2003-003906

(51) Int. Cl.
*G06F 17/50* (2006.01)
(52) U.S. Cl. ................. 716/4; 716/12; 716/19
(58) Field of Classification Search ............. 716/2, 716/4, 12, 19
See application file for complete search history.

(56) References Cited

U.S. PATENT DOCUMENTS 6,606,731 B1 * 8/2003 Baum et al. ............... 716/4

FOREIGN PATENT DOCUMENTS

| JP | 2887881 | 11/1990 |
|---|---|---|
| JP | 4205382 | 7/1992 |
| JP | 11297831 | 10/1999 |

* cited by examiner

*Primary Examiner*—Thuan Do
(74) *Attorney, Agent, or Firm*—Staas & Halsey LLP

(57) ABSTRACT

A layer defining unit defines different layer numbers to oblique wiring diagrams and via cell diagrams which are included in layout data of a semiconductor integrated circuit design. A first diagram blending unit fetches diagram data including the oblique wiring diagrams and the via cell diagrams from the layout data, synthesizes the diagrams every same layer number, and blends them in overlapped portions. An oblique wiring verifying unit verifies an interval between the oblique wiring diagrams blended by the first diagram blending unit by an allowable minimum interval value S. A second diagram blending unit synthesizes the verified oblique wiring diagram and the via mat diagram of the via cell, thereby forming an oblique wiring mask diagram blended in an overlapped portion. A blended diagram verifying unit verifies an interval between the oblique wirings having projecting portions by the via cells of the oblique wiring mask diagram blended by the second diagram blending unit by an allowable minimum interval value T (where, T<S).

21 Claims, 23 Drawing Sheets

FIG. 7
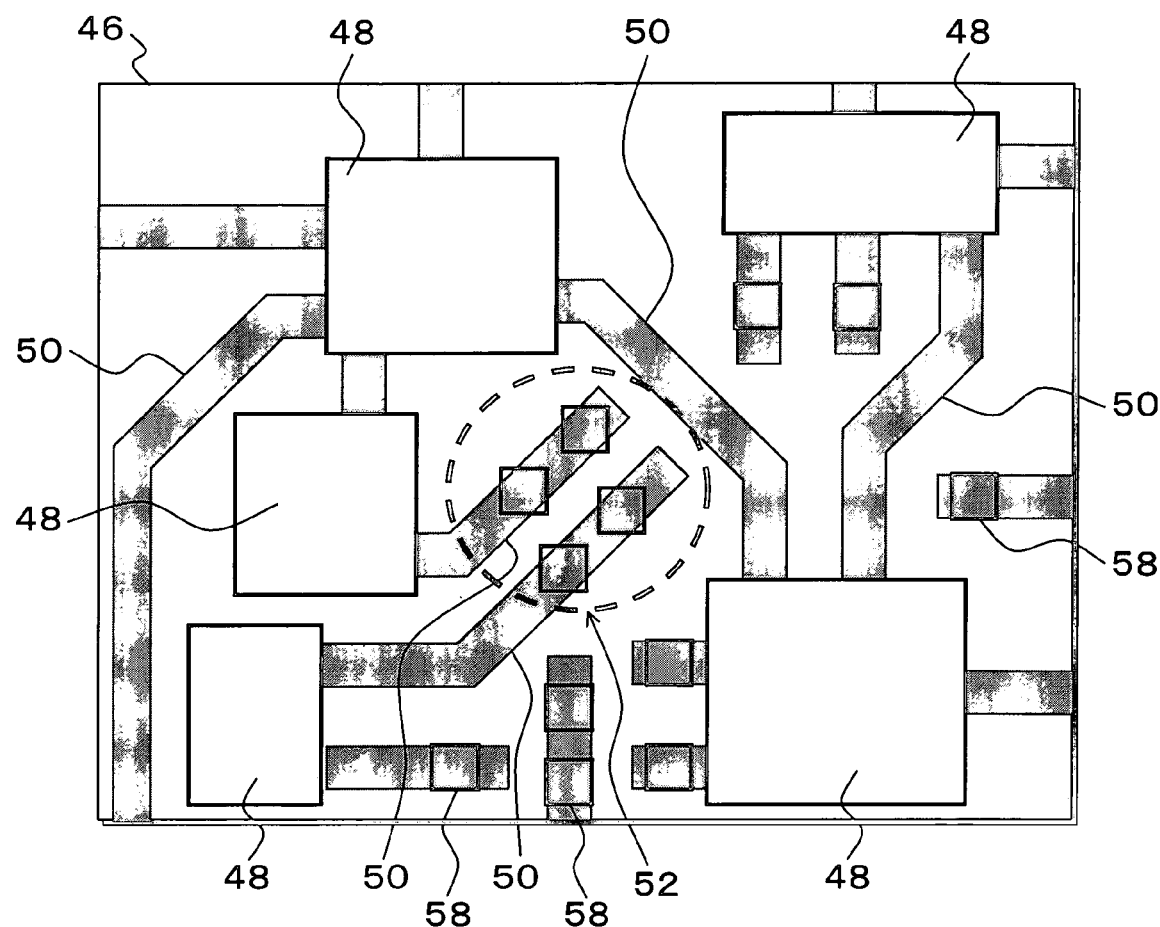
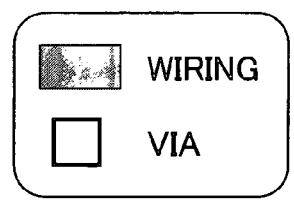

```
1   [DRC RULE]..............
2   /*LAYER DEFINITION SENTENCES*/
3   poly = Layer 5
4   via_1 = Layer 10
5   metal_1 = Layer 11
6   via_mat = Layer 12
7         :
8   *VERIFICATION RULES*
9      /* (1) VERIFICATION BY ALLOWABLE MINIMUM INTERVAL S*/
10     SPACE   metal_1   metal_1 < S
11     /* (2) FORM A BLENDED DIAGRAM(naname) OF metal_1 AND via_mat*/
12     naname = metal_1 OR via_mat
13     /* (3) VERIFICATION BY ALLOWABLE MINIMUM INTERVAL T*/
14     SPACE   metal_1   naname < T
15     SPACE   metal_1   via_mat < T
16     /* IS #T<S.*/
```

115 { (lines 2-7)
116 { (lines 9-10)
118 { (lines 11-12)
120 { (lines 13-16)

WIRING DIAGRAM VERIFYING METHOD, PROGRAM, AND APPARATUS

BACKGROUND OF THE INVENTION

1. Field of the Invention

The invention relates to computer-aided wiring diagram verifying method, program, and apparatus for forming diagram data for a wiring mask from layout data of a circuit design of a large scale semiconductor integrated circuit or the like and, more particularly, to wiring diagram verifying method, program, and apparatus for forming diagram data for a wiring mask including oblique wirings and via cells which are arranged on the oblique wirings from layout data and verifying the diagram data.

2. Description of the Related Arts

Hitherto, in computer-aided designing work of a large scale semiconductor integrated circuit, arrangement of elements is determined on the integrated circuit in accordance with a logic circuit diagram or an electronic circuit diagram called an arrangement wiring design or layout design and after wiring paths among those elements are decided, there is a diagram forming step of forming a mask based on them.

As is well known, layout verification is made in the layout design. The layout verification is made to confirm correctness of the design with respect to diagram forming data (art work data) for mask creation at the last stage of the design.

In the layout Verification, verification called a design rule check (DRC) is made. It is a step of verifying whether the diagram forming data violates a geometrical design rule, that is, a design rule which is designed in consideration of various limitations obtained by examining a manufacturing process or not.

In the conventional design check, whether the data violates the design rule or not is verified by checking an interval between the wiring diagrams on the basis of the design rule. Whether an interval between the wiring diagram and a via diagram, the via diagram, and the wiring diagram satisfy an overlap of them or not is verified so that a contact area after manufacturing can be guaranteed on the basis of the design rule.

Those methods are classical techniques and their general examples are shown in FIGS. 1A and 1B. In the conventional layout verification, first, as shown in FIG. 1A, wirings 300 and 302 of a wiring layer are drawn on the same layer as that of via cells 304 and 306 of a via cell layer on the basis of the layout data. If the wiring 300 and the via cell 304 overlap and the wiring 302 and the via cell 306 overlap by the drawing, respectively, as shown in FIG. 1B, they are automatically blended to be one diagram and metal wiring diagrams 308 and 310 are formed.

As shown in FIG. 1A, the via cells 304 and 306 have forms such that via mats 316 and 318 are coupled with vias 312 and 314, respectively. Wiring overlaps are formed around the vias 312 and 314 by the via mats 316 and 318. With respect to the wiring overlaps, the via mats 316 and 318 are prepared so that contact areas of the wirings 300 and 302 and the vias 312 and 314 have sizes which satisfy wiring overlap values which are held on the basis of the design rule.

Therefore, the via cells 304 and 306 constructed by the vias 312 and 314 and the via mats 316 and 318 become the metal wiring diagrams 308 and 310 as shown in FIG. 1B because the via mats 316 and 318 are blended with the wirings 300 and 302 by a blending process with the wirings 300 and 302.

Subsequently, whether the metal wiring diagrams 308 and 310 satisfy an allowable minimum interval value S between the wiring diagrams based on the geometrical design rule or not is verified. That is, an interval between the metal wiring diagrams 308 and 310 is scanned and since it becomes the minimum in a blended portion of the via cells at intervals 320 and 322, if the intervals 320 and 322 are equal to or larger than the allowable minimum interval value S, it is determined that the design rule is satisfied. If they are smaller than the allowable minimum interval value S, it is determined that an error has occurred. Generally, the allowable minimum interval value S between the wiring diagrams based on the design rule varies in accordance with wiring widths.

Further, also with respect to overlap values 326 and 328 of the vias 312 and 314 in the metal wiring diagrams 308 and 310, verification regarding whether allowable overlap values based on the design rule are satisfied or not is made. Generally, the allowable overlap values also vary in accordance with line widths of the wirings 300 and 302 where the vias 312 and 314 exist. (Refer to JP-A-11-297831, the Official Gazette of Japanese Patent No. 2953051, and the Official Gazette of Japanese Patent No. 2580772.)

Although a wiring pattern is arranged in the horizontal and vertical directions in the conventional layout design, in recent years, in order to shorten a wiring length, reduce a line resistance and a floating capacity, and improve transmitting characteristics accompanied by the realization of a high frequency, an oblique wiring such that the wiring pattern is arranged in the oblique direction of 45° is used. However, in the layout verification regarding the oblique wiring as a target, there are the following problems.

FIG. 2 is an explanatory diagram of the design rule check regarding the oblique wiring as a target. In such a design rule check, oblique wirings 402 and 404 of an oblique wiring layer 400 and via cells 408 and 410 of a via mat layer 406 are fetched as those on the same layer and drawn by an automatic blending process 412, thereby forming blended oblique wiring diagrams 416 and 418 onto a blended diagram layer 414.

Also in this case, the via cells 408 and 410 are constructed by vias 420 and 422 and via mats 424 and 426 and portions of the via mats 424 and 426 are blended with the oblique wirings 402 and 404.

With respect to the blended oblique wiring diagrams 416 and 418, as enlargedly shown in FIG. 3, whether an interval 425 of the oblique wiring portion satisfies the allowable minimum interval value S between the wiring diagrams based on the design rule or not is verified. If it is smaller than the allowable minimum interval value S, it is determined that an error has occurred.

However, in the blended oblique wiring diagrams 416 and 418, projecting portions 427, 428, 430, and 432 are caused in the direction which perpendicularly crosses the oblique wirings due to the blending of the via mats arranged around the vias 420 and 422 so as to have overlap values.

With respect to the projecting portions 427, 428, 430, and 432, if projection amounts lie within a range of manufacturing errors, vertices are rounded at the time of manufacturing. Therefore, with respect to the verification of an interval 434 between the projecting portion 428 of the blended oblique wiring diagram 416 and the blended oblique wiring diagram 418 and an interval 436 between the projecting portion 430 of the blended oblique wiring diagram 418 and the blended oblique wiring diagram 416, an allowable minimum interval value T smaller than the allowable minimum interval value S between the oblique wirings is set.

However, in the design rule check, in the case where the verification of the allowable minimum interval value S between the oblique wirings is executed on the basis of the design rule, with respect to the intervals 434 and 436 of the projecting portions 428 and 430 from the wiring width, although the allowable minimum interval value T regarding the projecting portions is satisfied, the allowable minimum interval value S between the oblique wirings larger than the value T is not satisfied. The diagram forming data violates the design rule, so that a pseudo error occurs.

Therefore, if the projecting portions due to the blending of the via cells exist in the verification of the interval between the oblique wirings, the pseudo error occurs and the intervals cannot be correctly verified.

To avoid such a pseudo error, also with respect to the projecting portions which satisfy the allowable minimum interval value T, the intervals have to be widened so as to have the allowable minimum interval value S between the oblique wirings. To arrange them so as to eliminate all violations in the design rule check, an interval between the oblique wirings larger than needed is required.

An increase in wiring interval due to it results in an increase in wiring length and an increase in area of a chip. Various benefits such as saving of the wiring length owing to the oblique wirings, reduction of wiring delay, improvement of a yield owing to the decrease in chip area, and the like cannot be obtained.

SUMMARY OF THE INVENTION

According to the invention, there are provided wiring diagram verifying method, program, and apparatus which enable verification by different allowable minimum interval values with respect to oblique wiring diagrams and with respect to oblique wirings and projecting portions without causing a pseudo error due to projection in via cell blended portions of the oblique wiring diagrams.

(Method)

The invention provides a computer-aided wiring diagram verifying method of verifying diagram data for a wiring mask including oblique wirings which are formed from layout data of a semiconductor integrated circuit design and via cells which are arranged on the oblique wirings.

The wiring diagram verifying method is characterized by comprising:

a layer defining step wherein different layer numbers are defined by a layer defining unit 26 to oblique wiring diagrams and via cell diagrams which are included in layout data of a semiconductor integrated circuit design;

a first diagram blending wherein diagram data including the oblique wiring diagrams and the via cell diagrams is fetched from the layout data, the diagrams are synthesized every same layer number, and they are blended in overlapped portions by a first diagram blending unit 28;

an oblique wiring verifying step wherein the oblique wiring diagrams blended in the first diagram blending step are verified by an oblique wiring verifying unit 30;

a second diagram blending step wherein the verified oblique wiring diagram and the via cell diagram are synthesized and an oblique wiring mask diagram blended in an overlapped portion is formed by a second diagram blending unit 32; and a blended diagram verifying step wherein the oblique wiring mask diagram blended in the second diagram blending step is verified by a blended diagram verifying unit 34.

As mentioned above, according to the wiring diagram verifying method of the invention, by defining the oblique wiring layer and the via mat layer as different layers, the oblique wiring diagram is solely drawn without being blended with the via cell diagram and the oblique wiring diagram and the via cell diagram can be individually blended as diagrams of the different layers (first diagram blending step). Therefore, the pseudo error which is caused by the interval between the oblique wiring and a projecting portion due to the blending of the via cell is avoided and the verification by the allowable minimum interval value S between the wiring diagrams can be made.

By executing the blending process of the layers (second diagram blending step) with respect to the oblique wirings and the via cells of different layers, the oblique wiring mask diagram in which both of them are blended is formed, and the verification by the allowable minimum interval value T of the projecting portion due to the blending of the oblique wirings and the via mats can be made to the oblique wiring mask diagram.

The first diagram blending step is characterized in that
the oblique wiring diagrams are fetched and blended,
the via cell diagrams constructed by the via diagrams and via mat diagrams surrounding them are fetched and blended, and the second diagram blending step is characterized in that
the oblique wiring diagram blended in the first diagram blending step and the via mat diagram of the via cell diagram are blended in the overlapped portion.

In the oblique wiring verifying step, whether an interval between the adjacent oblique wiring diagrams violates a predetermined design rule or not is verified. That is, in the oblique wiring verifying step, whether the interval between the adjacent oblique wiring diagrams violates the allowable minimum interval value S based on the predetermined design rule or not is verified.

In the blended diagram verifying step, whether an interval between the oblique wiring diagram and the via cell diagram blended on the oblique wiring adjacent to the oblique wiring diagram violates a predetermined design rule or not is verified. That is, the oblique wiring diagrams are inclined from the horizontal and vertical directions by 45°. The via cell diagram has a rectangular shape exceeding a line width of the oblique wiring. The via cell on the oblique wiring blended in the second diagram blending step has a blended shape such that a corner portion which perpendicularly crosses the oblique wiring direction is projected over the line width of the oblique wiring. In the blended diagram verifying step, whether an interval between the projecting portion of the oblique wiring due to the blending of the via cells and the oblique wiring diagram adjacent to the projecting portion violates the allowable minimum interval value T based on the predetermined design rule or not is verified.

In the blended diagram verifying step, if the via cell exists solely adjacent to the oblique wiring, whether an interval between the oblique wiring and a corner edge of the via cell diagram which faces the oblique wiring diagram so as to perpendicularly crosses it violates the allowable minimum interval value T based on the predetermined design rule or not is verified.

In the via mat diagram in the invention, a wiring overlap which assures a necessary and sufficient contact area of the via cell and the oblique wiring is formed around the via.

(Program)

The invention provides a program for the wiring diagram verification for verifying diagram data for a wiring mask including oblique wirings which are formed from layout data of a semiconductor integrated circuit design and via cells which are arranged on the oblique wirings.

The program is characterized by allowing a computer to execute:

a layer defining step wherein different layer numbers are defined to diagram data of oblique wirings and data of via cell diagrams which are included in layout data of a semiconductor integrated circuit design;

a first diagram blending step wherein diagram data including the oblique wiring diagrams and the via cell diagrams is fetched from the layout data and they are blended every same layer number;

an oblique wiring verifying step wherein the oblique wiring diagrams blended in the first diagram blending step are verified;

a second diagram blending step wherein the oblique wiring diagram blended in the first diagram blending step and the via cell diagram are blended, thereby forming an oblique wiring mask diagram; and a blended diagram verifying step wherein the oblique wiring mask diagram blended in the second diagram blending step is verified.

Details of the program according to the invention are fundamentally the same as those of the wiring diagram verifying method.

(Apparatus)

The invention provides a computer-aided wiring diagram verifying apparatus for forming diagram data for a wiring mask including oblique wirings and via cells which are arranged on the oblique wirings from layout data of a semiconductor integrated circuit design.

The wiring diagram verifying apparatus is characterized by comprising: a layer defining unit which defines different layer numbers to oblique wiring diagrams and via cell diagrams which are included in layout data of a semiconductor integrated circuit design; a first diagram blending unit which fetches diagram data including the oblique wiring diagrams and the via cell diagrams from the layout data and blends the diagrams every same layer number; an oblique wiring verifying unit which verifies the oblique wiring diagrams blended by the first diagram blending unit; a second diagram blending unit which blends the oblique wiring diagram blended by the first diagram blending unit and the via cell diagram, thereby forming an oblique wiring mask diagram; and a blended diagram verifying unit which verifies the oblique wiring mask diagram blended by the second diagram blending unit.

Details of the wiring diagram verifying apparatus according to the invention are fundamentally the same as those of the wiring diagram verifying method.

The above and other objects, features, and advantages of the present invention will become more apparent from the following detailed description with reference to the drawings.

BRIEF DESCRIPTION OF THE DRAWINGS

FIG. 7 is an explanatory diagram of a wiring mask diagram to which the wiring diagram verification of the invention is applied;

FIG. 16 is an explanatory diagram of a specific example of layer definition sentences and verification rules which are used in execution of a design rule check in the invention;

DETAILED DESCRIPTION OF THE PREFERRED EMBODIMENTS

Figure 1A:
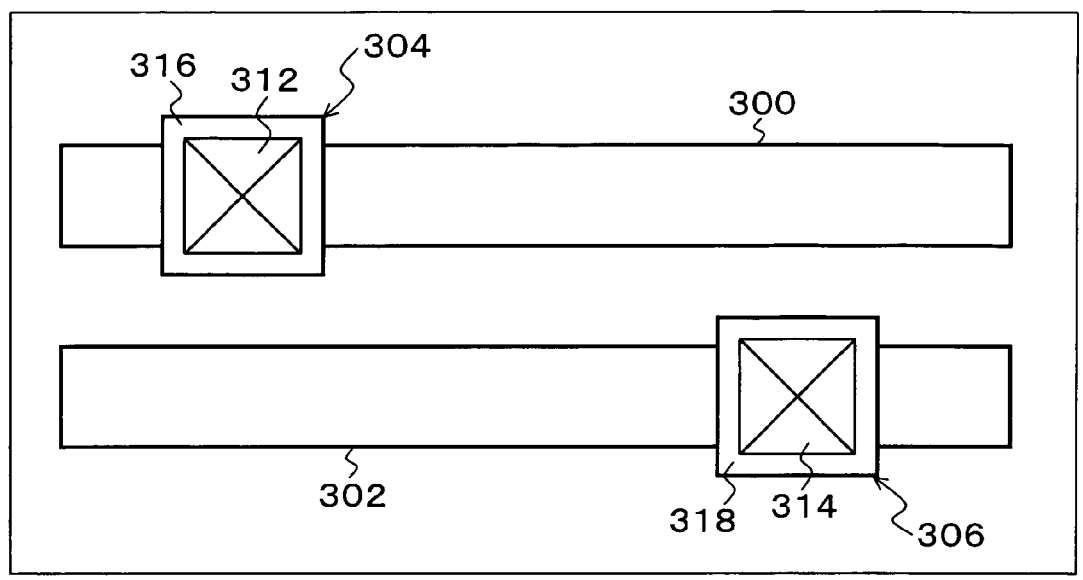
FIGS. 1A and 1B are explanatory diagrams of creation of a wiring mask diagram and interval verification according to a conventional design rule check.
Figure 1B:
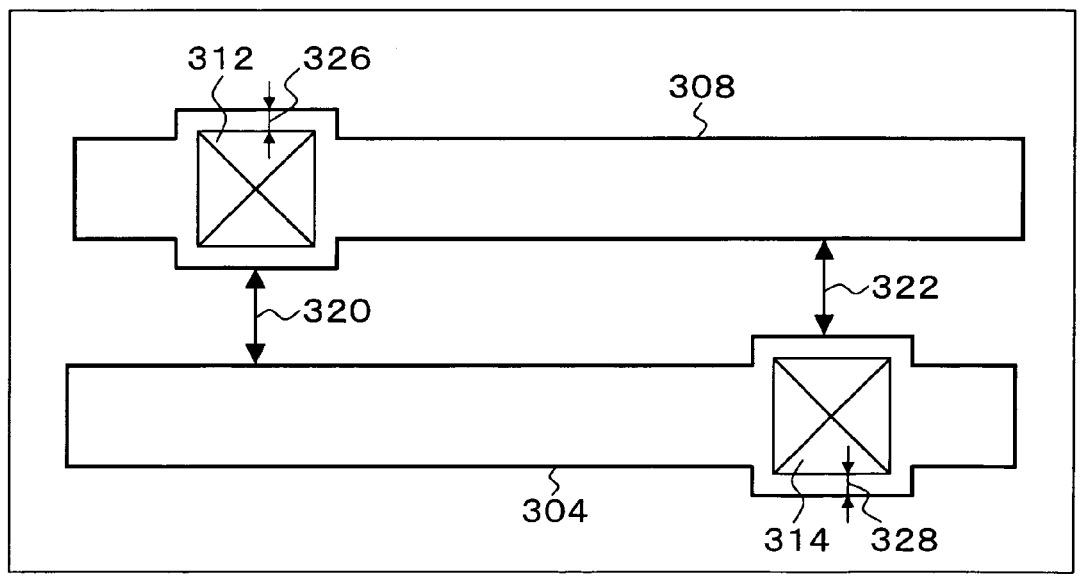
Figure 2:
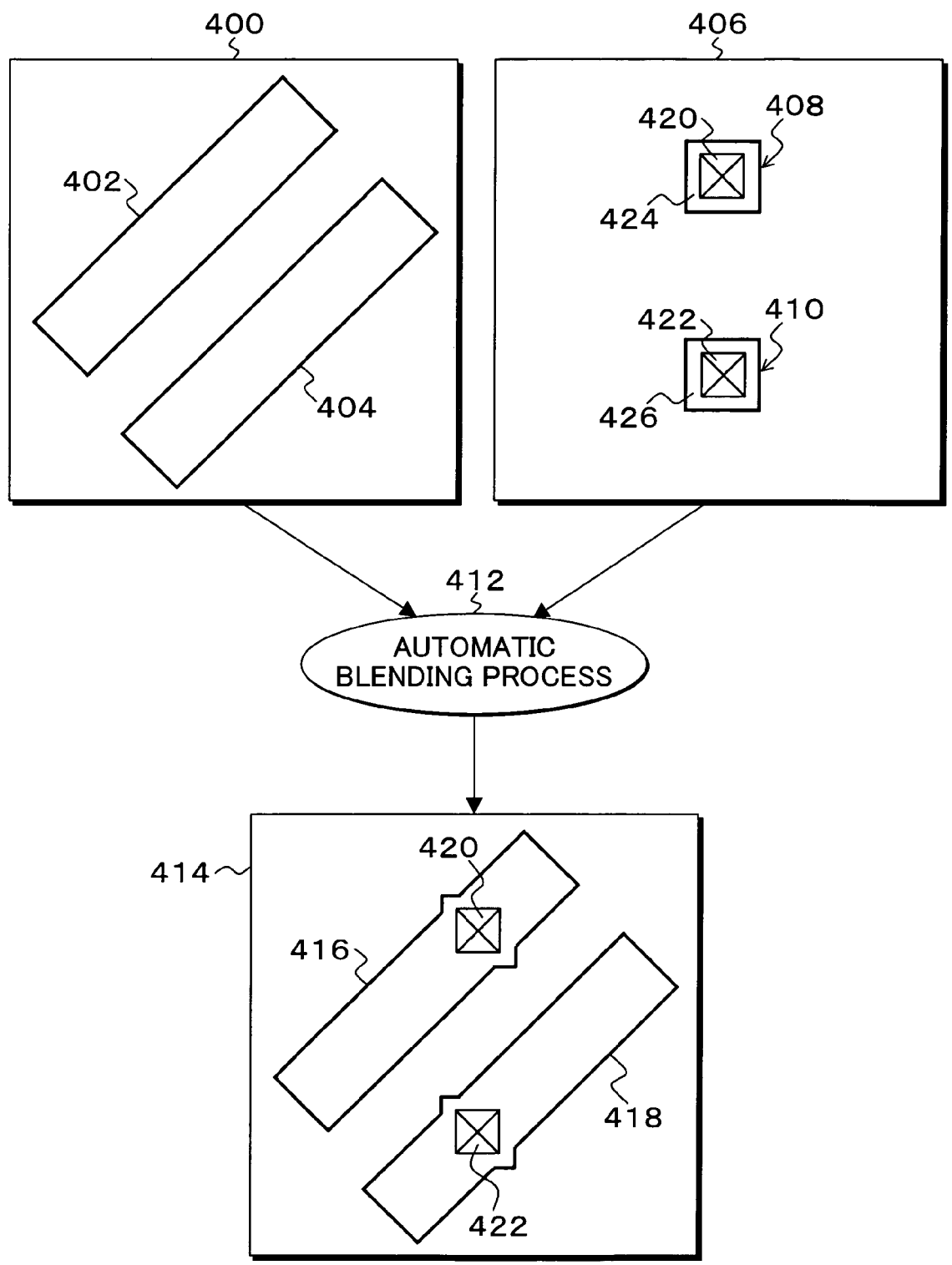
FIG. 2 is an explanatory diagram of a blending process for forming an oblique wiring mask diagram according to the conventional design rule check.
Figure 3:
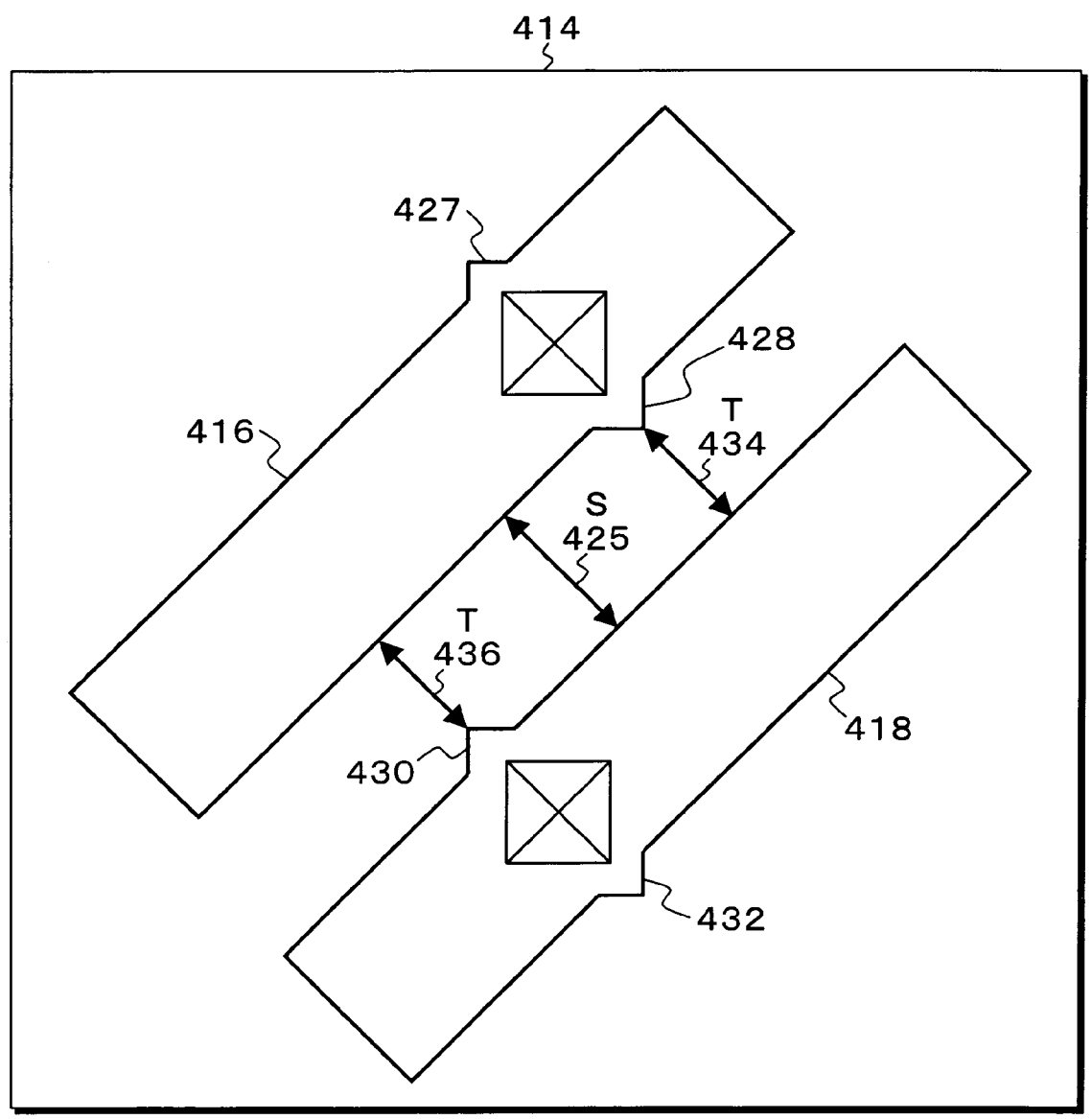
FIG. 3 is an explanatory diagram of the interval verification in the conventional oblique wiring mask diagram.
Figure 4:
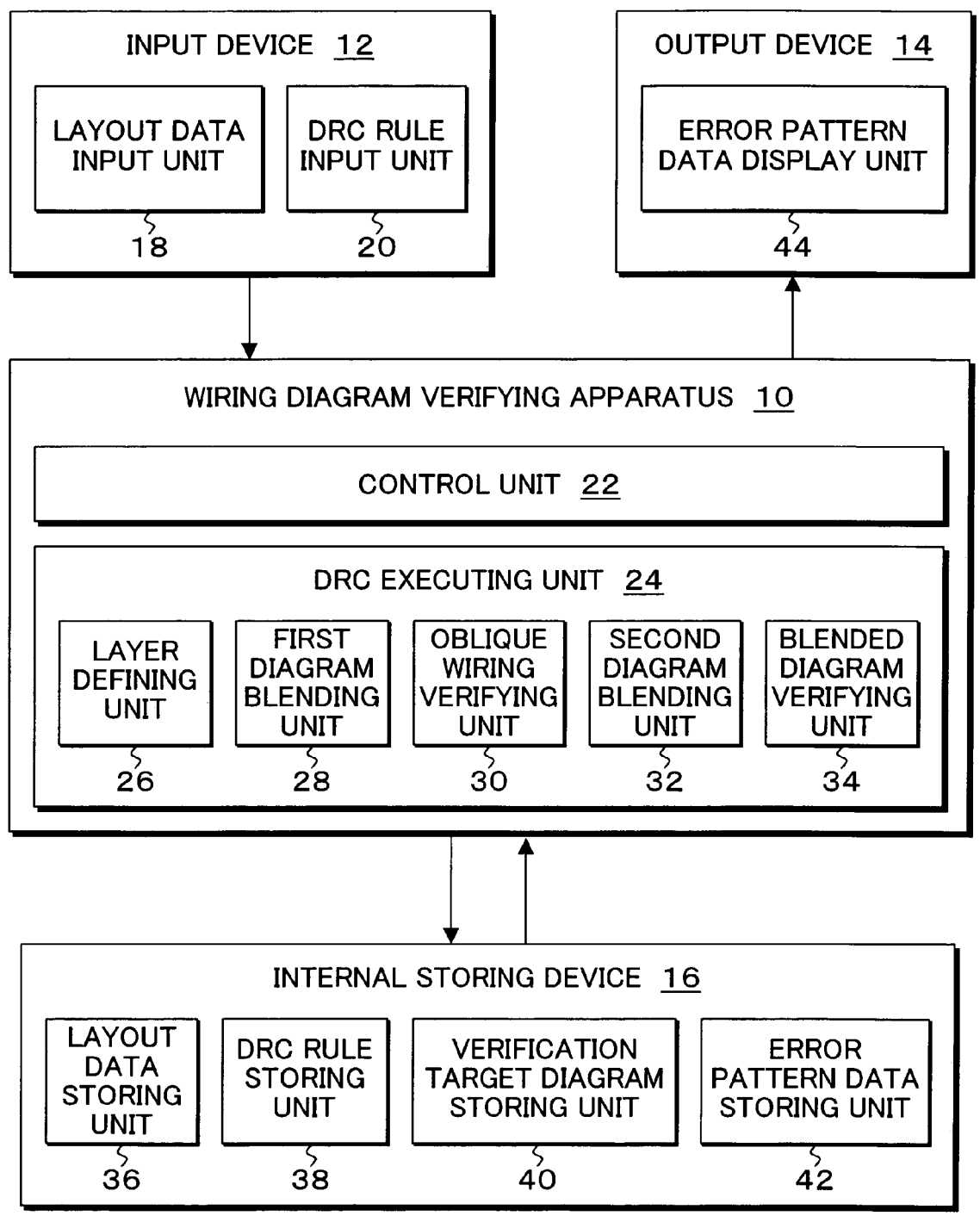
FIG. 4 is a block diagram of a system construction to which a wiring diagram verifying method of the invention is embodied.

FIG. 4 is a block diagram of a system construction to which a wiring diagram verifying method of the invention is embodied. In FIG. 4, the system to which the wiring diagram verifying method of the invention is embodied is constructed by: a wiring diagram verifying apparatus 10; an input device 12; an output device 14; and further, an internal storing device 16 of the wiring diagram verifying apparatus 10.

A layout data input unit 18 and a DRC rule input unit 20 are provided for the input device 12. The layout data input unit 18 receives layout data in which a designing process has been completed and stores it into a layout data storing unit 36 of the internal storing device 16.

The DRC rule input unit 20 receives a DRC rule as execution information for executing a design rule check of a wiring diagram formed from the inputted layout data and stores it into a DRC rule storing unit 38 of the internal storing device 16.

A control unit 22 for making the whole control and a DRC executing unit 24 are provided for the wiring diagram verifying apparatus 10. To execute the wiring diagram verifying apparatus according to the invention, functions of a layer defining unit 26, a first diagram blending unit 28, an oblique wiring verifying unit 30, a second diagram blending unit 32, and a blended diagram verifying unit 34 are provided for the DRC executing unit 24.

In correspondence to the processing functions of the DRC executing unit 24, a verification target diagram storing unit 40 and an error pattern data storing unit 42 to store an error pattern obtained by a verification result are provided for the internal storing device 16. An error pattern data display unit 44 to display the error pattern obtained as a verification result by the DRC executing unit 24 is provided for the output device 14.

Processing contents of the functional units provided for the DRC executing unit 24 are as follows. The layer defining unit 26 defines different layer numbers to an oblique wiring diagram and a via cell diagram which are included in the layout data. The first diagram blending unit 28 executes a diagram blending process of the first stage for fetching diagram data including the oblique wiring diagram and the via cell diagram from the layout data and blending the diagrams of the same layer number.

The oblique wiring verifying unit 30 executes a verifying process by a predetermined allowable minimum interval value S between the oblique wirings by a geometrical design rule to the oblique wiring diagrams obtained by the blending process of the first diagram blending unit 28 as targets.

The second diagram blending unit 32 blends the oblique wiring diagram blended by the first diagram blending unit 28 and the via cell diagram, thereby forming an oblique wiring mask diagram. The blended diagram verifying unit 34 makes verification by a predetermined allowable minimum interval value T (where, T<S) to the oblique wiring diagrams blended by the second diagram blending unit 32 and the oblique wiring diagram including the via cell diagram as targets with respect to the interval between the oblique wiring and a projecting portion of the via cell.

Figure 5:
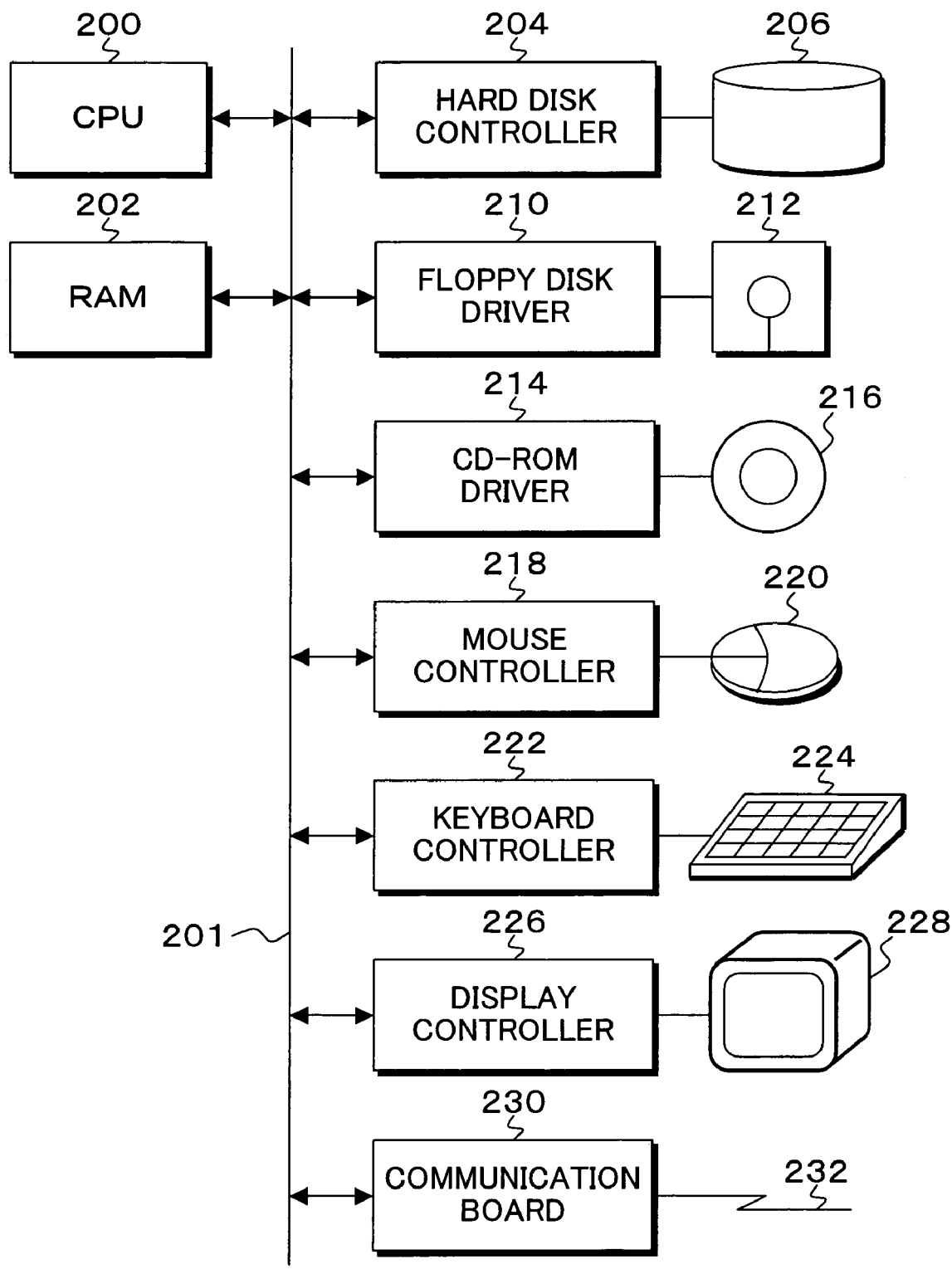
FIG. 5 is an explanatory diagram of a hardware environment of a computer to which a wiring diagram verifying apparatus in FIG. 4 according to the invention is applied.

The wiring diagram verifying apparatus 10 of the invention in FIG. 4 is realized by, for example, hardware resources of a computer as shown in FIG. 5. In the computer of FIG. 5, a RAM 202, a hard disk controller (software) 204, a floppy disk driver (software) 210, a CD-ROM driver (software) 214, a mouse controller 218, a keyboard controller 222, a display controller 226, and a board 230 for communication are connected to a bus 201 of a CPU 200.

A hard disk drive 206 is connected to the hard disk controller 204 and an application program to execute the design rule check of the invention has been loaded in the hard disk controller 204. When the computer is activated, the hard disk controller 204 calls a necessary program from the hard disk drive 206, develops it onto the RAM 202, and executes it by the CPU 200.

A floppy disk drive (hardware) 212 is connected to the floppy disk driver 210 and the reading and writing operations from/to a floppy disk (registered trademark) can be executed. A CD drive (hardware) 216 is connected to the CD-ROM driver 214 and data and a program stored in a CD can be read out.

The mouse controller 218 transfers the inputting operation of a mouse 220 to the CPU 200. The keyboard controller 222 transfers the inputting operation of a keyboard 224 to the CPU 200. The display controller 226 performs a display onto a display unit 228. The communicating board 230 communicates with another computer or a server via a network such as Internet or the like by using a communicating line 232 including a wireless manner.

Figure 6:
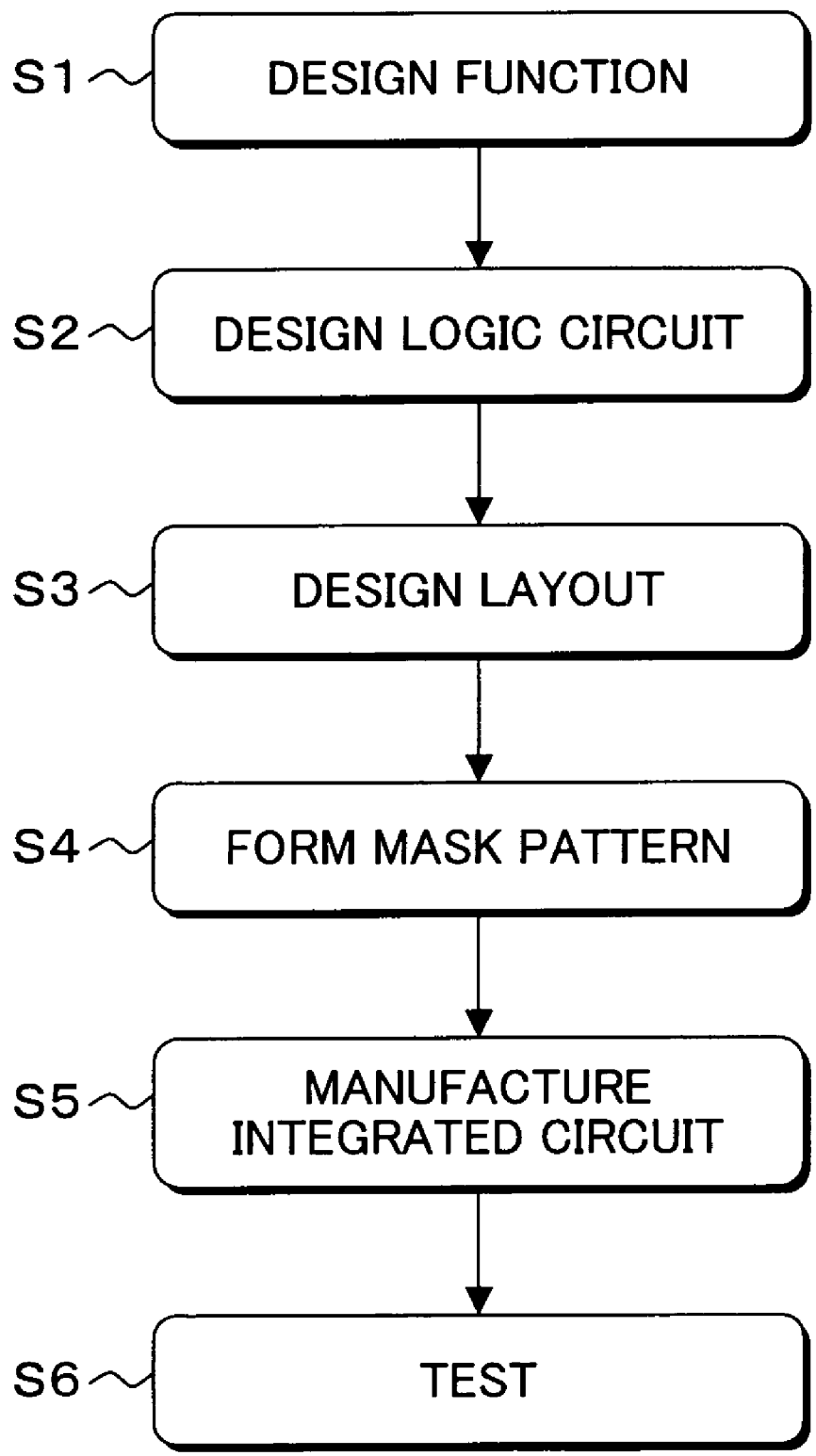
FIG. 6 is an explanatory diagram of steps for a semiconductor integrated circuit design including wiring diagram verification according to the invention.

FIG. 6 is an explanatory diagram of steps for a computer-aided semiconductor integrated circuit designing process including a layout design in which a wiring diagram verifying method of the invention is executed.

In the steps of the semiconductor integrated circuit designing process, first, in step S1, a function design to decide a construction of functions of the whole chip is made. Subsequently, in step S2, a logic circuit design to decide circuit parameters and a connection between the circuits is made. In next step S3, a layout design to arrange and wire cells is made.

The layout design is made ordinarily in accordance with a procedure of the cell arranging process, a schematic wiring process, and a detailed wiring process. In the layout design, layout verification is performed to layout data, as a target, obtained by the completion of the arrangement and wiring of the cells. In the layout verification, verification by the design rule check (DRC) according to the invention is made.

When the layout design is completed, a mask pattern is formed in step S4. Subsequently, in step S5, an integrated circuit based on the mask pattern formed in step S5 is manufactured. The manufactured integrated circuit is lastly tested in step S6.

FIG. 7 shows an example of a wiring mask diagram to which the wiring diagram verifying process according to the invention is applied. In FIG. 7, the wiring mask diagram is formed on a mask layer 46 by a drawing process based on the layout data. In this example, cells 48 are arranged at five positions and oblique wirings 50 are performed to the cells 48 in addition to vertical and lateral wirings.

A via cell 58 is formed at a predetermined position of each wire, thereby enabling an electrical connection to another wiring layer. In the wiring diagram of such a mask layer 46, the wiring diagram verifying process according to the invention is executed with respect to, for example, the oblique wirings 50, as targets, having the via cells 58 existing in a verification target portion 52 surrounded by a broken line.

Figure 8:
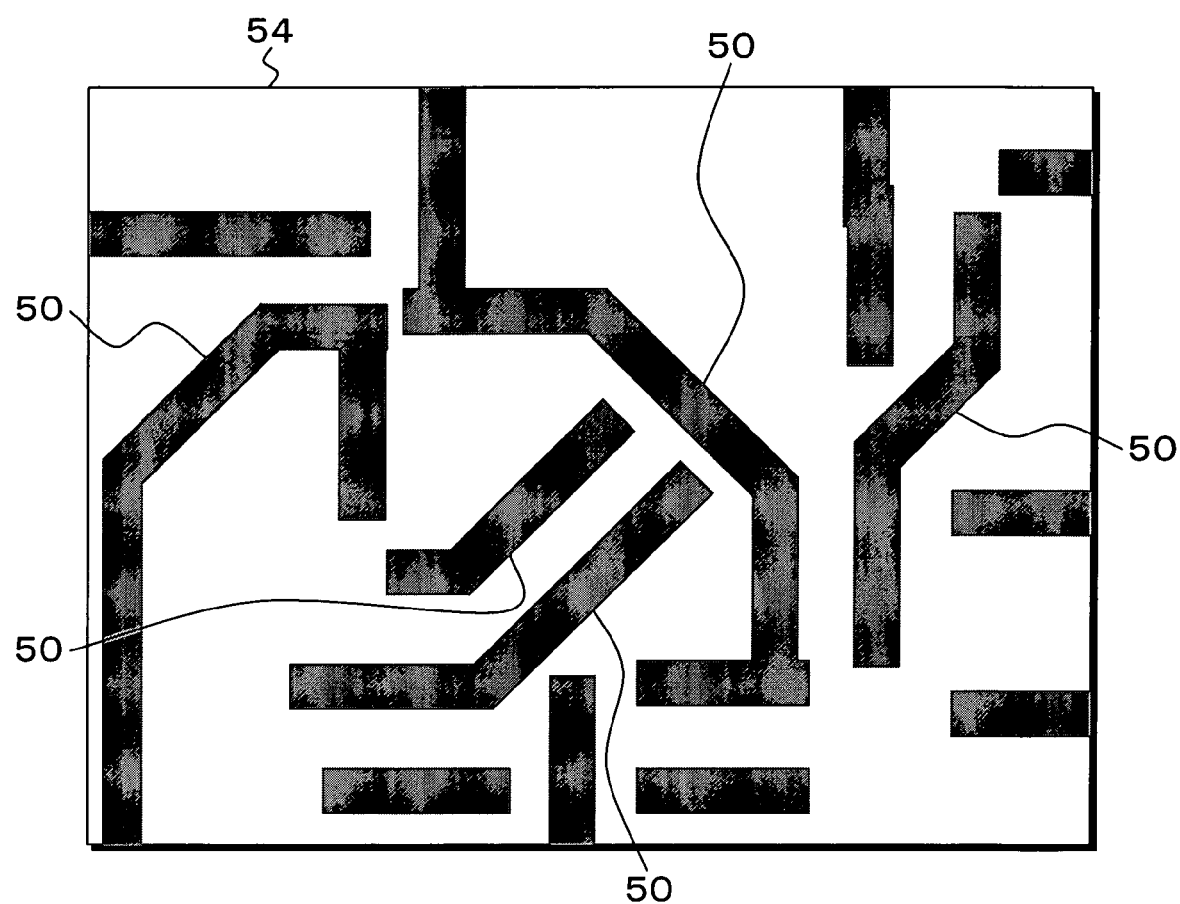
FIG. 8 is an explanatory diagram of a wiring diagram of a wiring layer which is blended with FIG. 7.

FIG. 8 is an explanatory diagram of a wiring diagram of a wiring layer 54 which is used to form the wiring mask diagram of FIG. 7. In FIG. 8, in the wiring layer 54, a wiring diagram including the vertical wirings, the lateral wirings, and further, the oblique wirings 50 as targets of the invention is formed. That is, the wiring diagram of the wiring layer 54 can be regarded as a diagram before the blending in which the cells 48 and the via cells 58 are eliminated from the wiring mask diagram of the mask layer 46 of FIG. 7.

Figure 9:
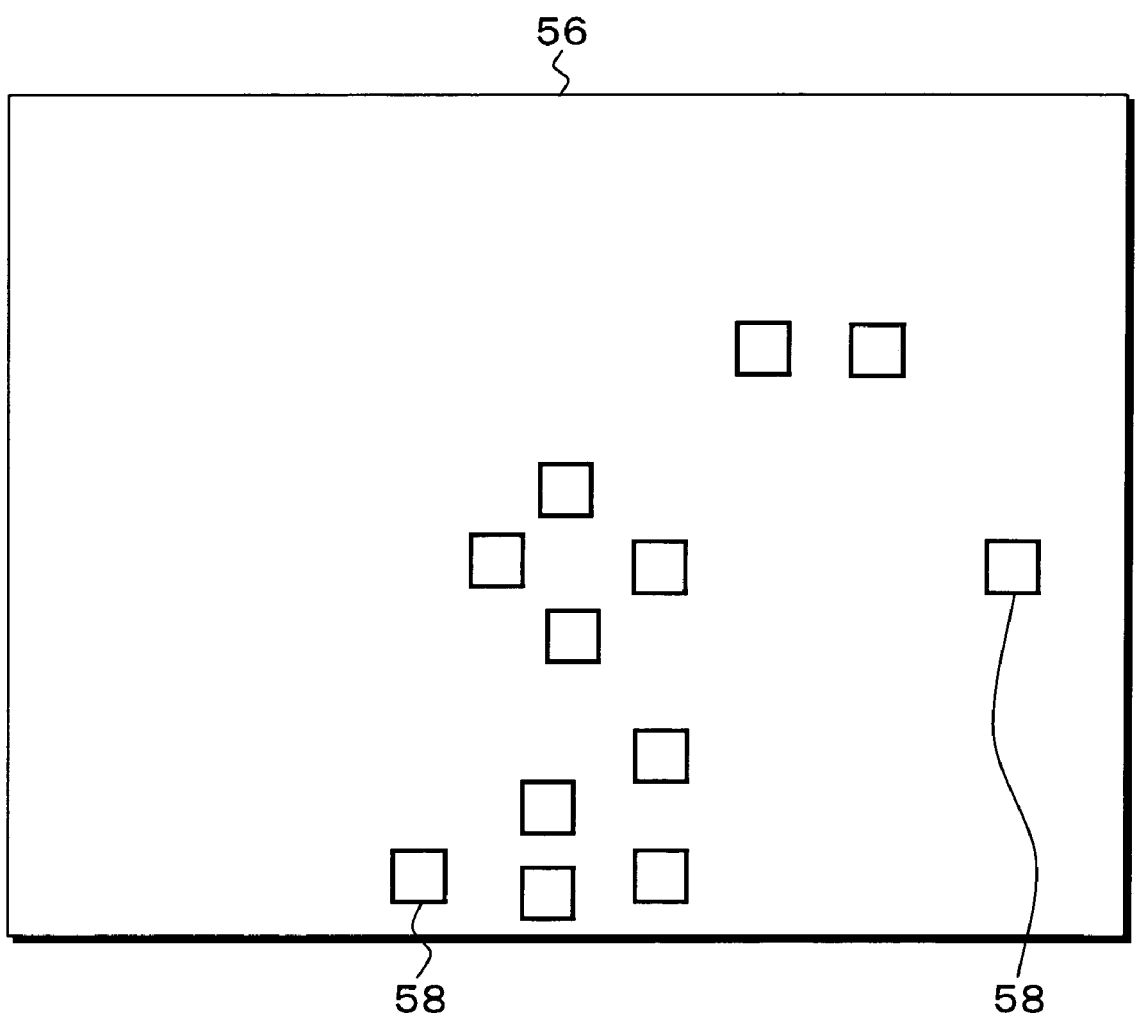
FIG. 9 is an explanatory diagram of a via mat diagram in a via mat layer which is blended with FIG. 7.

FIG. 9 shows a via mat diagram of the via cells 58 in a via mat layer 56 which is used to form the wiring mask diagram of FIG. 7. In the via mat layer 56, the wiring diagram is a diagram before the blending in which the cells 48, vertical wirings, lateral wirings, and oblique wirings 50 are eliminated from the mask layer 46 of FIG. 7. Only via mat diagrams of the via cells 58 are arranged.

Therefore, in the executing process of the design rule check as a wiring diagram verifying process according to the invention, by preparing the wiring diagrams of the wiring layer 54 of FIG. 8 and the via cell diagrams of the via mat layer 56 of FIG. 9 and, further, adding the cell diagrams of the cell layer, they are blended and the wiring mask diagrams of the mask layer 46 as shown in FIG. 7 is formed, and, for example, the wiring interval between the oblique wirings 50 of the verification target portion 52 is verified.

Figure 10:
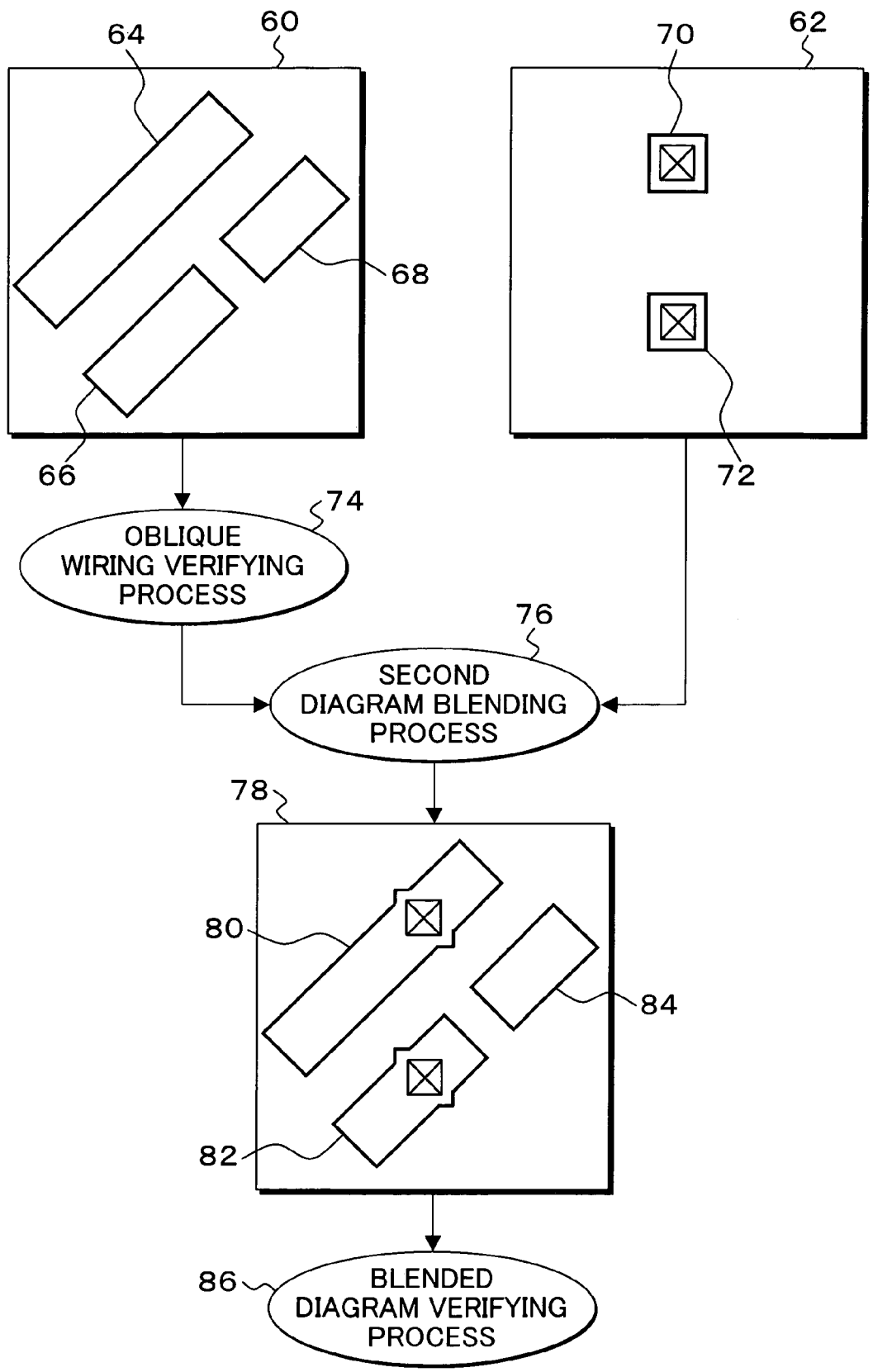
FIG. 10 is an explanatory diagram of the first embodiment of an oblique wiring verifying process according to the invention.

FIG. 10 is an explanatory diagram of the first embodiment of the oblique wiring verifying process according to the invention. The oblique wiring verifying process according to the invention has the following five processing procedures.

(1) The definition of the layer numbers
(2) The first blending process for blending the diagram data of the same layer number
(3) The verifying process of the oblique wirings
(4) The second blending process of the oblique wirings and the via cells
(5) The verifying process of the blended diagram In the oblique wiring verifying process of FIG. 10, the processes after completion of (1) the definition of the layer numbers and (2) the first blending process are shown.

First, in a wiring layer 60, oblique wiring diagrams are formed by blending oblique wirings 64, 66, and 68 to which the same layer number has been added. In a via mat layer 62, via cell diagrams are formed by blending vias and via mats of via cells 70 and 72 of the same layer number. The creation of the diagrams of the wiring layer 60 and the via mat layer 62 becomes a processing result of the blending process of the first stage.

Subsequently, in the invention, an oblique wiring verifying process 74 is executed to the oblique wirings 64, 66, and 68 of the wiring layer 60 as targets. In the oblique wiring verifying process 74, whether each of an interval between the oblique wiring 64 and the oblique wiring 66 adjacent thereto and an interval between the oblique wiring 64 and the oblique wiring 68 adjacent thereto is larger than the predetermined allowable minimum interval value S which has been decided by the geometrical design rule or not is verified. If it is equal to or larger than the allowable minimum interval value S, it is determined that the design rule is satisfied. If it is smaller than the allowable minimum interval value S, it is determined that the interval violates the design rule, and error data is formed.

After completion of the oblique wiring verifying process 74 to the oblique wirings 64, 66, and 68 of the wiring layer 60, a second diagram blending process 76 is executed. In the second diagram blending process 76, the blending of the layer diagrams of the wiring layer 60 and the via mat layer 62 is executed. Metal wiring diagrams 80 and 82 in which the via cells 70 and 72 have been blended with the oblique wirings 64 and 66 are formed onto a mask layer 78 by the second diagram blending process 76. The oblique wiring 68 becomes a metal wiring diagram 84 as it is because the via cell 70 is not blended.

When the metal wiring diagrams 80, 82, and 84 are formed on the mask layer 78, a blended diagram verifying process 86 is executed. In the blended diagram verifying process 86, the verification by the predetermined allowable minimum interval value T by the geometrical design rule is performed to intervals, as targets, between the projecting portions due to the blending with the via cells 70 and 72 in the metal wiring diagrams 80 and 82 and the metal wiring diagrams adjacent to those projecting portions.

If the interval between the projecting portion and the oblique wiring is equal to or larger than the allowable minimum interval value T, it is determined that the interval satisfies the design rule. If it is smaller than the allowable minimum interval value T, it is determined that the interval violates the design rule and the error data is formed.

Figure 11:
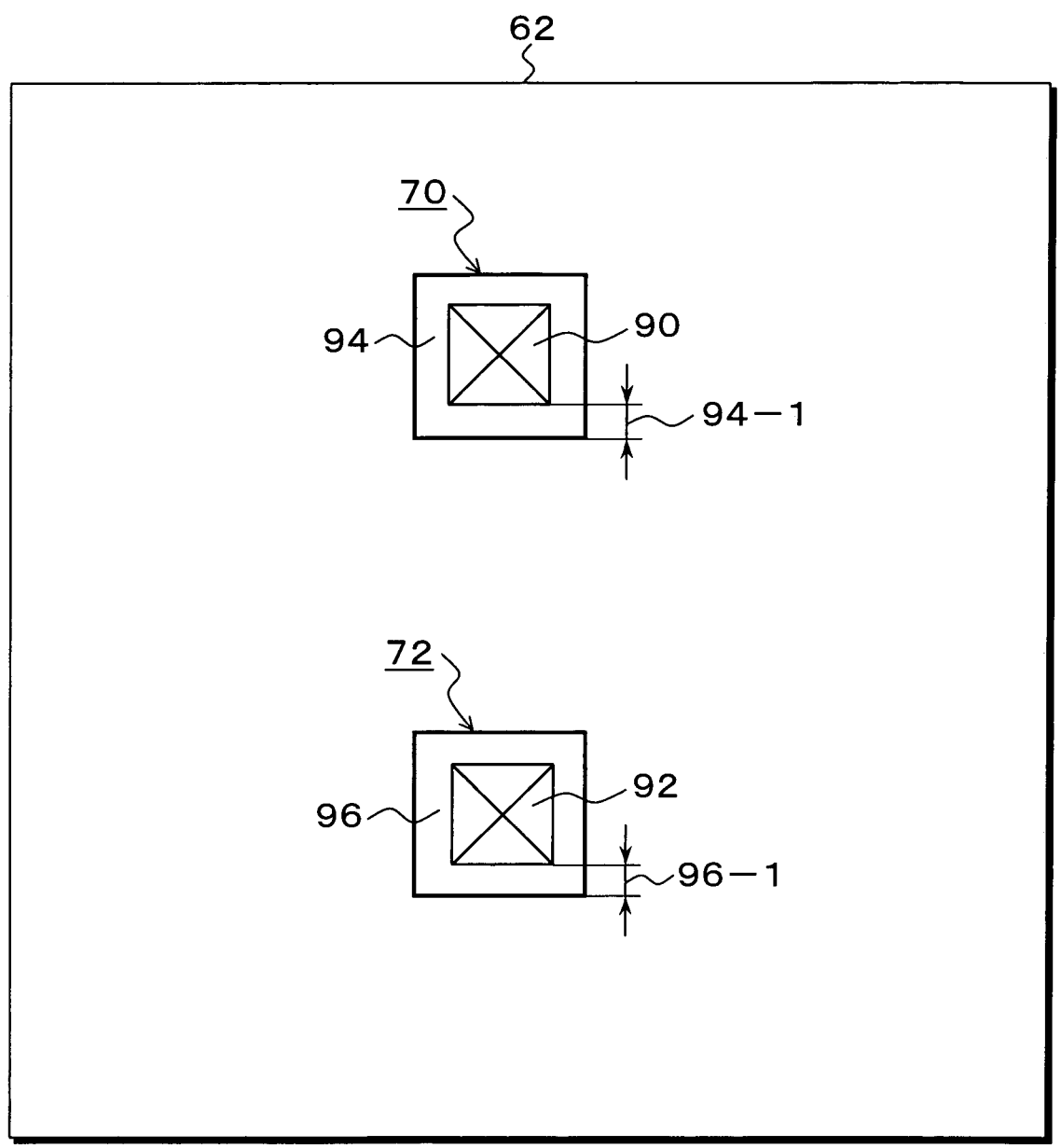
FIG. 11 is an explanatory diagram of a via mat diagram in a via mat layer in FIG. 10.

FIG. 11 is a diagram showing the via mat layer 62 extracted from FIG. 10. The via cells 70 and 72 arranged on the via mat layer 62 are constructed by vias 90 and 92 and via mats 94 and 96, respectively.

The via mats 94 and 96 are designed so as to sufficiently assure contact areas between the vias 90 and 92 and the oblique wirings when they are blended with the oblique wirings 64 and 66 as shown in the mask layer 78 in FIG. 10. In the invention, optimum wiring overlap values 94-1 and 96-1 to assure the contact areas which are peculiar to the oblique wirings have been preset with respect to the via mats 94 and 96 which are blended with the oblique wirings.

Therefore, in the executing process of the design rule check in the invention, since the proper wiring overlap values have been preset with respect to the via mats of the via cells 70 and 72 which are blended with the oblique wirings, there is no need to verify the wiring overlap values in the verifying process, so that the processes can be simplified.

Figure 12:
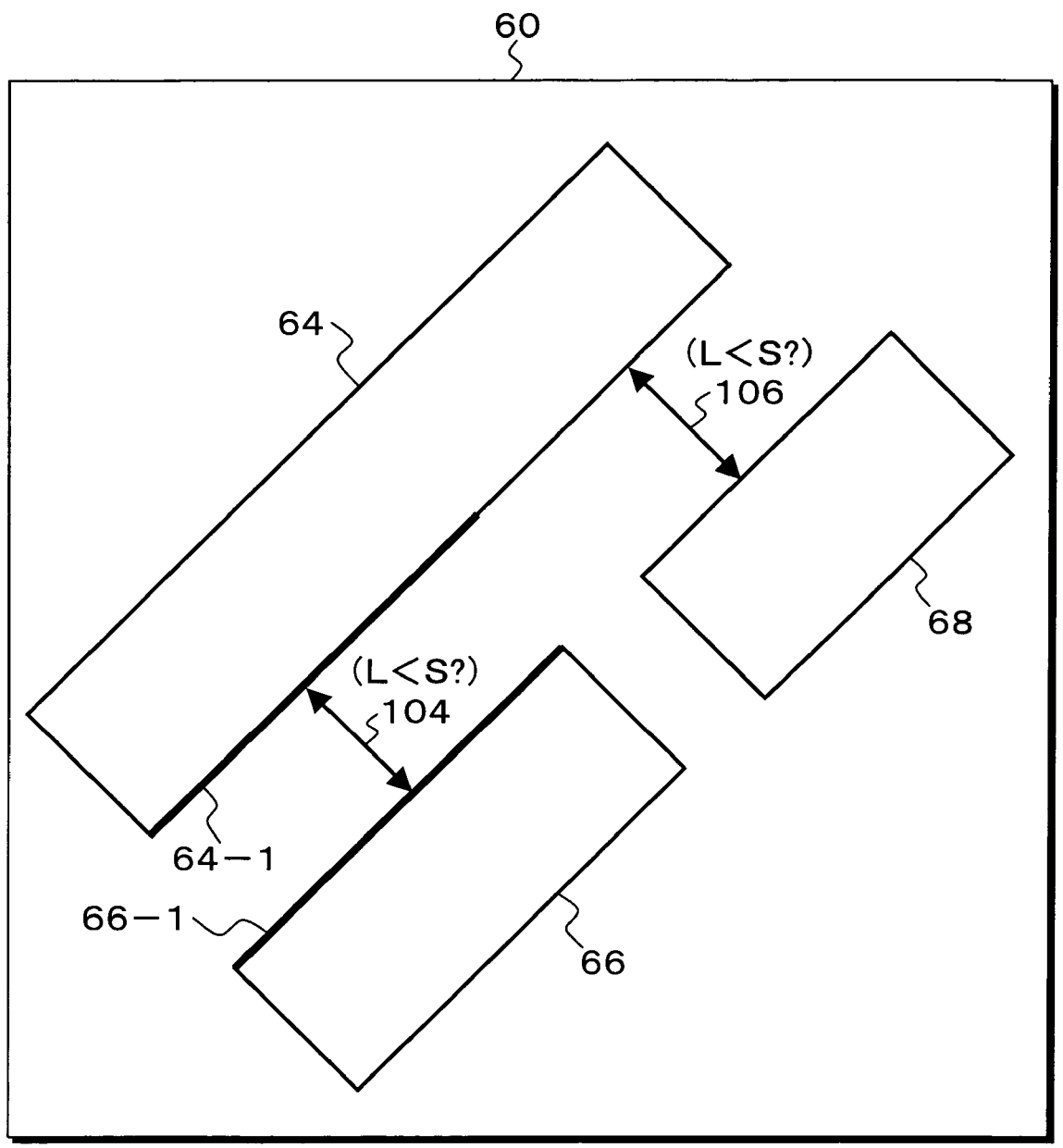
FIG. 12 is an explanatory diagram of an oblique wiring diagram and interval verification in an oblique wiring layer in FIG. 10.

FIG. 12 is an explanatory diagram of the verifying process by the oblique wiring verifying process 74 regarding the wiring layer 60 in FIG. 10 as a target. With respect to the oblique wirings 66 and 68 adjacent to the oblique wiring 64 formed with regard to the wiring layer 60, both intervals 104 and 106 shown by arrows are compared with the allowable minimum interval value S of the oblique wiring intervals determined by the design rule while operating in the oblique wiring direction. If they are smaller than the allowable minimum interval value S, it is determined that the interval violates the design rule, and error data is formed.

When the error data is formed, for example, if the interval 104 between the oblique wiring 64 and the oblique wiring 66 is smaller than the allowable minimum interval value S and the interval violates the design rule, error data which designates an edge line of the oblique wiring 64 and an edge line of the oblique wiring 66 where an arrow 104 is located is formed and displayed by the error pattern data display unit 44 in the output device 14 in FIG. 4 so that they can be distinguished from other edge lines, for example, like error displays 64-1 and 66-1 shown by bold lines. As error displays, the edge lines which are ordinarily shown in black can be also displayed by switching the color from black to, for example, red or the like.

Figure 13:
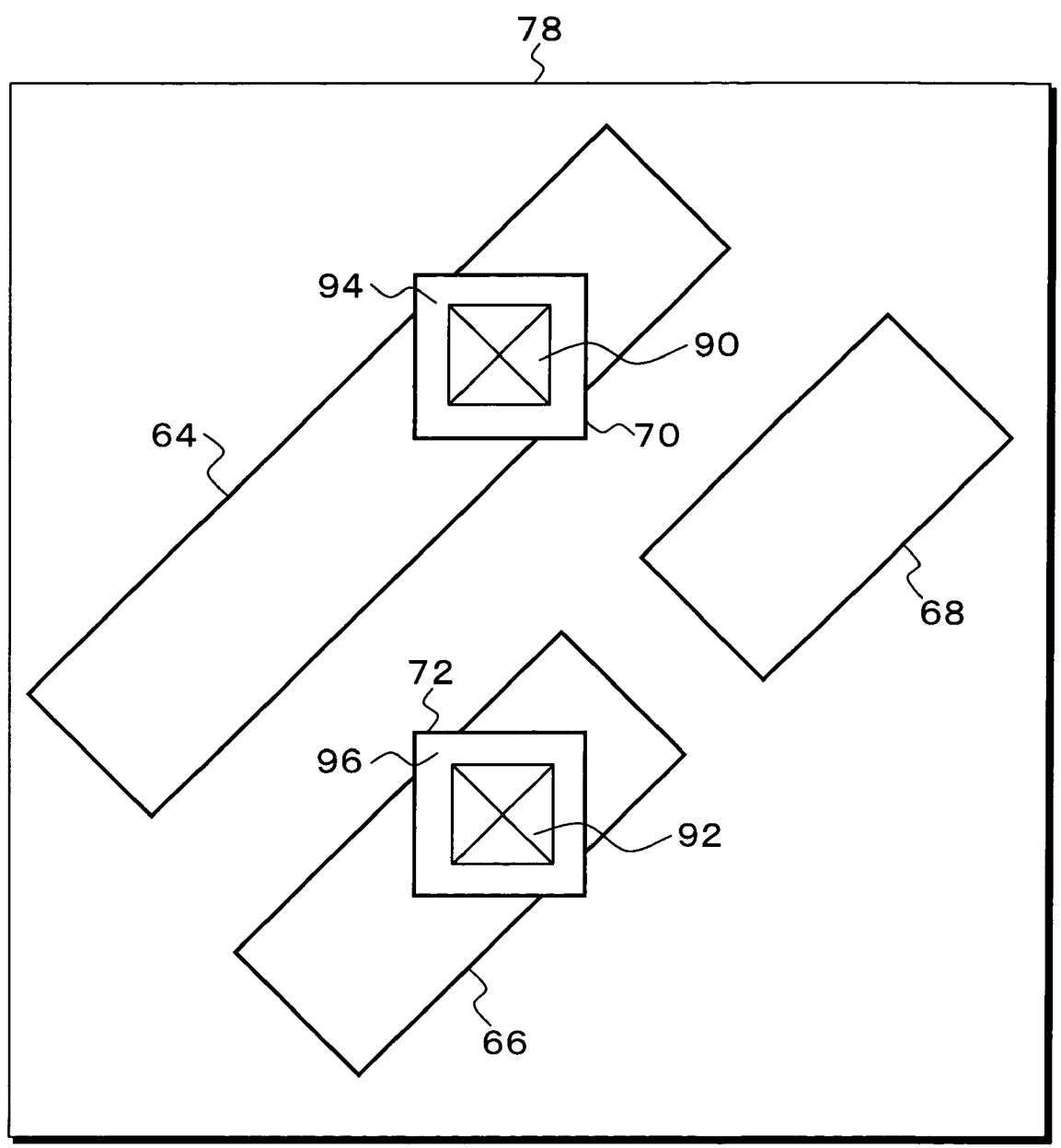
FIG. 13 is an explanatory diagram of an oblique wiring mask diagram before blending in FIG. 10.

FIG. 13 is an explanatory diagram before the mask layer 78 is blended in the second diagram blending process 76 in FIG. 10. In the state before the blending of the mask layer 78, the blending process is executed in a manner such that the via cells 70 and 72 are arranged to the oblique wirings 64 and 66 and, in this state, the via mats 94 and 96 are in the via cells 70 and 72 are integrated with the oblique wirings 64 and 66, so that the metal wiring diagrams 80 and 82 in the mask layer 78 extracted and shown in FIG. 12 are obtained.

Figure 14:
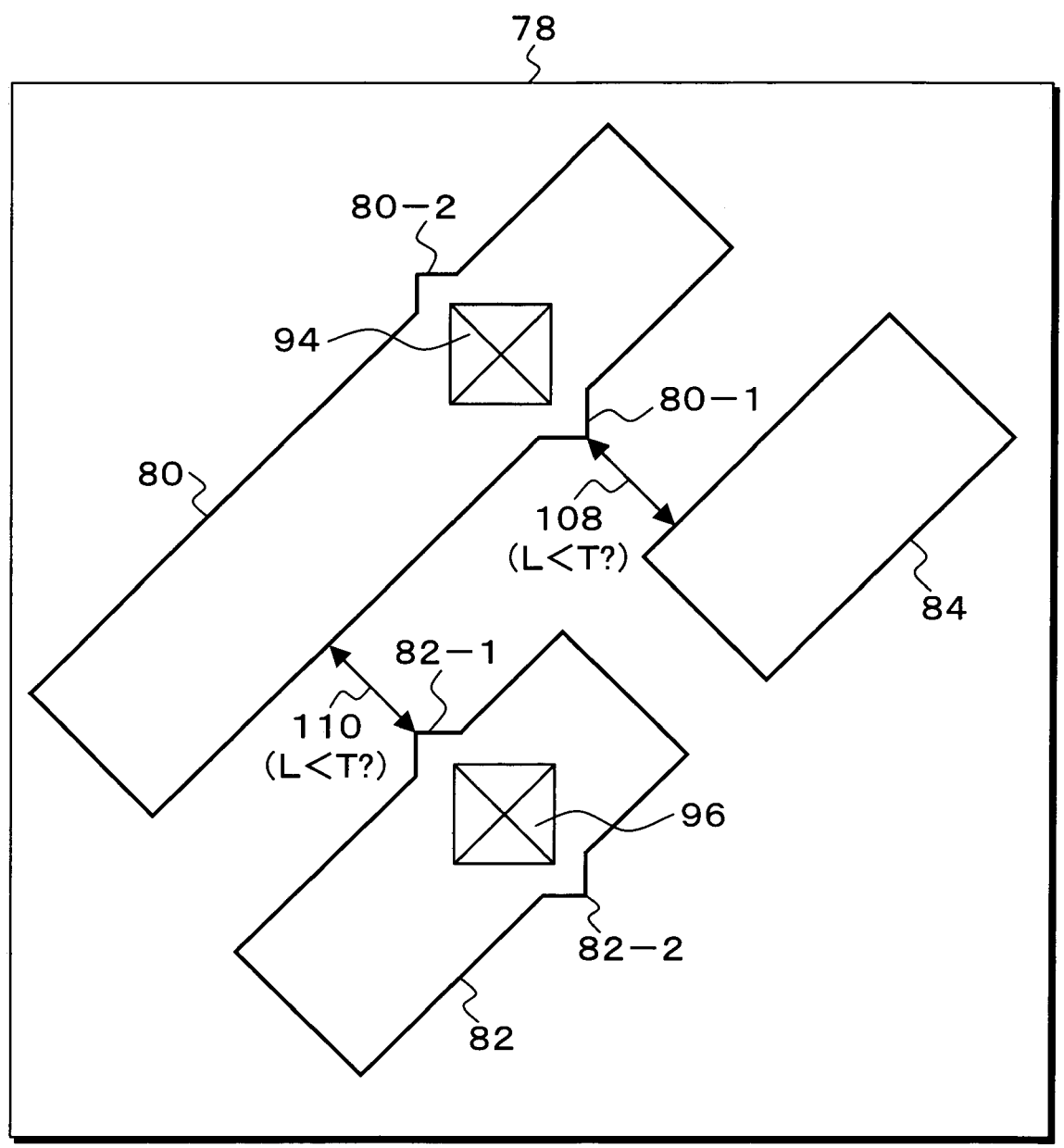
FIG. 14 is an explanatory diagram of a blended oblique wiring mask diagram and the interval verification in FIG. 10.

FIG. 14 is an explanatory diagram of an interval verifying process with respect to the metal wiring diagrams of the mask layer 78 in FIG. 10 as targets. In the metal wiring diagrams 80 and 82 in the mask layer 78, projecting portions 80-1 and 80-2 and projecting portions 82-1 and 82-2 are caused in the direction which perpendicularly crosses the oblique wiring direction by the blending of the via cells to the oblique wirings.

When a semiconductor is actually manufactured, vertices of front edges of the projecting portions 80-1 and 80-2 and projecting portions 82-1 and 82-2 are rounded. Therefore, the verifying process of the intervals based on the allowable minimum interval value T between the oblique wirings and the projecting portions which is smaller than the allowable minimum interval value S between the oblique wirings is executed in consideration of the roundness upon manufacturing.

That is, whether an interval 108 between the vertex of the projecting portion 80-1 of the metal wiring diagram 80 and the edge line of the metal wiring diagram 84 which faces it satisfies the allowable minimum interval value T or not is verified. If it is smaller than the allowable minimum interval value T, it is determined that the interval violates the design rule, and error data is formed.

With respect to an interval 110 between the projecting portion 82-1 of the metal wiring diagram 82 and the edge line of the metal wiring diagram 80, verification by the allowable minimum interval value T is made. If it is smaller than the allowable minimum interval value T, it is determined that the interval violates the design rule, and error data is formed.

As mentioned above, in the wiring interval verifying process of the invention, since the verification regarding the interval between the oblique wirings is executed before the blending of the via cells is performed, the generation of the pseudo error by the interval verification based on the projecting portions by the via cells of the oblique wirings upon blending can be certainly prevented.

By executing the verification of the oblique wirings and the projecting portions by the via cells after the oblique wirings and the via cells are blended, the verification can be made independently of the verification of the interval between the oblique wirings. Further, with respect to the overlap values to the oblique wirings of the vias, since the proper wiring overlap values which assure the contact areas of the oblique wirings and the vias have been preset, the verification of the overlap values is not particularly necessary.

Figure 15:
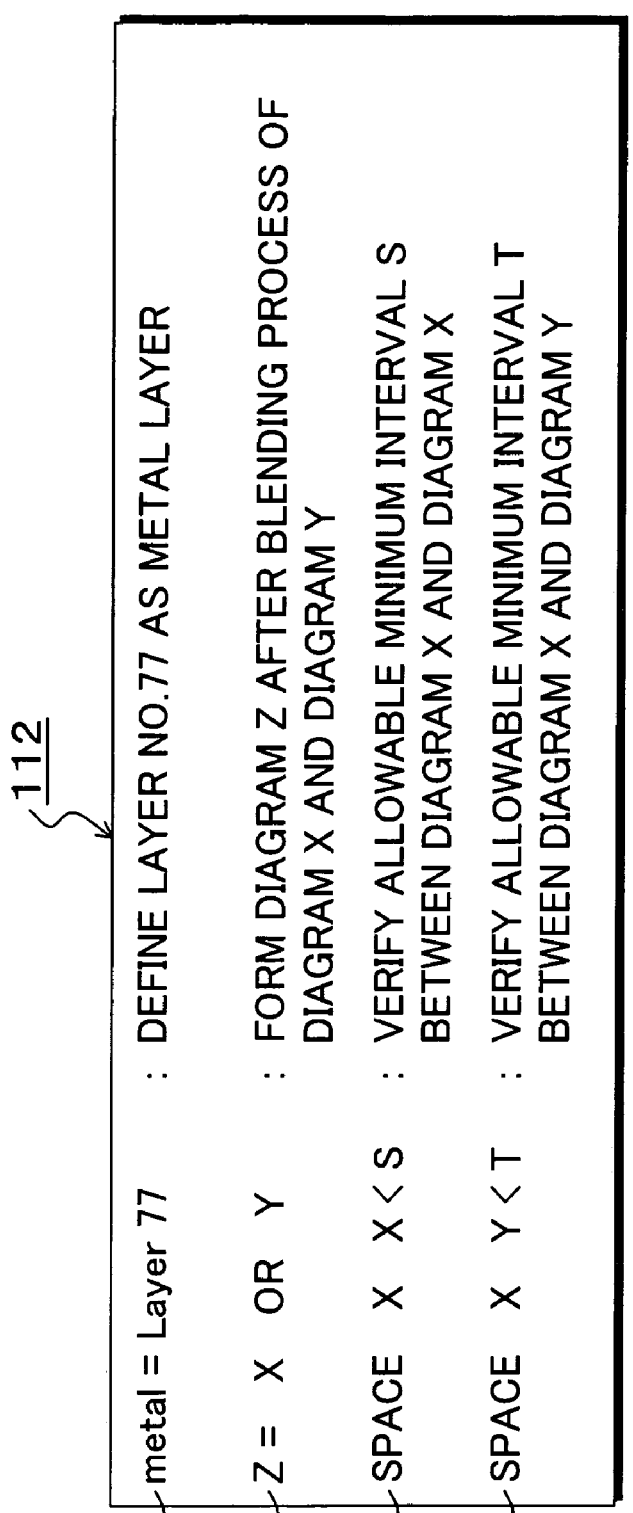
FIG. 15 is an explanatory diagram of a general example of design rule check execution information which is used in the invention.

FIG. 15 shows a general example of a description of design rule check execution information 112 which is used in the executing process of the design rule verification according to the invention. The execution information 112 for the design rule check according to the invention is constructed by four control sentences: a layer definition sentence 112-1; a diagram blending process 112-2; a verifying process 112-3 by the allowable minimum interval S; and a verifying process 112-4 by the allowable minimum interval T.

That is, by describing the layer definition sentence 112-1 as "metal=Layer 77", the layer number 77 is defined as a blended layer (metal layer).

By describing the blending process 112-2 as "Z=X OR Y", creation of a diagram Z obtained after a blending process of a diagram X and a diagram Y is instructed.

By describing the verifying process 112-3 of the allowable minimum interval S as "SPACE X X<S", verification of the allowable minimum interval S between the diagram X and the diagram X is instructed. Further, by describing the verifying process 112-4 of the allowable minimum interval T as "SPACE X Y<T", verification of the allowable minimum interval T between the diagram X and the diagram Y is instructed.

FIG. 16 shows a specific example of design rule check execution information 114 based on the general example of the description of FIG. 15. The design rule check execution information 114 is constructed by: a layer definition sentence 115; a verifying process 116 of the allowable minimum interval S; a blending process 118; and a verifying process 120 of the allowable minimum interval T.

Figure 17:
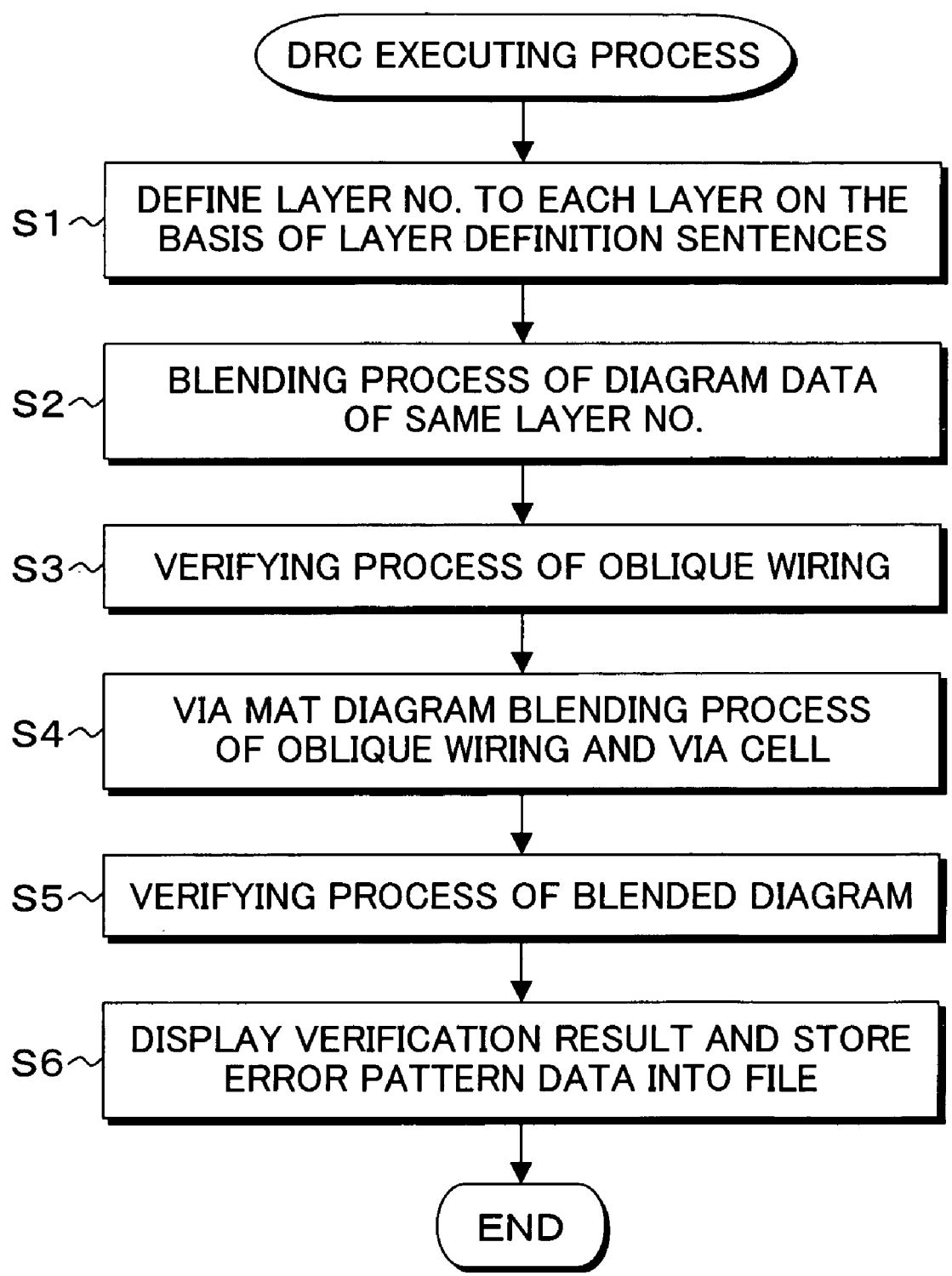
FIG. 17 is a flowchart for a process for executing the design rule check according to the invention.

FIG. 17 is a flowchart for a process for executing the design rule check in the invention based on the functions of the DRC executing unit 24 in FIG. 4. A processing procedure of this flowchart also shows a processing procedure for an executing program of the design rule check according to the invention.

In FIG. 17, the executing process of the design rule check will be described as follows with reference to the design rule check execution information 114 in FIG. 16. First, in step S1, layer numbers are defined for the layers on the basis of the layer definition sentence 115.

In the layer definition sentence 115 in FIG. 16, assuming that an oblique wiring diagram has been drawn by using the layer of "metal_1" of the 5th line, the layer number of the eleventh layer is defined here as "Layer 11". With respect to the via cell, assuming that it has been drawn by using "via_mat" of the 6th line, the twelfth layer is defined here as a layer number "Layer 12".

Subsequently, in step S2, the blending process of the diagram data of the same layer number, that is, the blending process of the first stage is executed. That is, a plurality of oblique wiring diagrams serving as an eleventh layer defined on the 5th line of the layer definition sentence 115 are blended and the via cell diagrams defined on the twelfth layer of the 6th line are blended.

Subsequently, in step S3, the verifying process of the oblique wirings is executed. In the verifying process of the oblique wirings, in accordance with the instruction of the verifying process 116 of the allowable minimum interval S of the ninth to tenth lines in FIG. 16, it is verified that the interval between the oblique wiring diagrams is smaller than the allowable minimum interval S. If it is smaller than the allowable minimum interval S, the error data is formed.

Subsequently, in step S4, the blending process of the oblique wirings and the via mat diagrams of the via cells is executed. In the blending process, in accordance with the instructions of the blending process 118 of the 11th to 12th lines in FIG. 16, the oblique wiring diagram and the via cell diagram are blended, and "naname" is formed as a blended diagram.

Subsequently, in step S5, the verifying process by using the allowable minimum interval value T is executed with respect to the intervals between the projecting portions accompanied by the blending of the via mat diagrams of the via cells in the blended diagram and the oblique wirings which face the projecting portions. That is, the processes according to the instructions of the verifying process 120 of the 13th to 16th lines in FIG. 16 are executed.

Specifically speaking, whether the interval between the oblique wiring and the blended diagram is smaller than the allowable minimum interval T or not is verified on the 14th line. If it is smaller than the allowable minimum interval T, the generation of the error is determined. Further, also with respect to the interval between the oblique wiring and the via cell, the verification of the interval using the allowable minimum interval T is similarly made on the 5th line.

After completion of such a verifying process, the verification result is displayed and the error pattern data is stored as a file in step S6. When the error pattern data is displayed with respect to the oblique wiring by the executing process of the design rule check, if the error is determined with respect to, for example, the verification target portion 52 surrounded by the broken line in the wiring diagram of the mask layer 46 of FIG. 7, an adjustment to widen the interval between the oblique wirings 50 in which the error has occurred is made. After that, the verifying process is executed again and a layout result which satisfies the minimum interval is formed.

Figure 18:
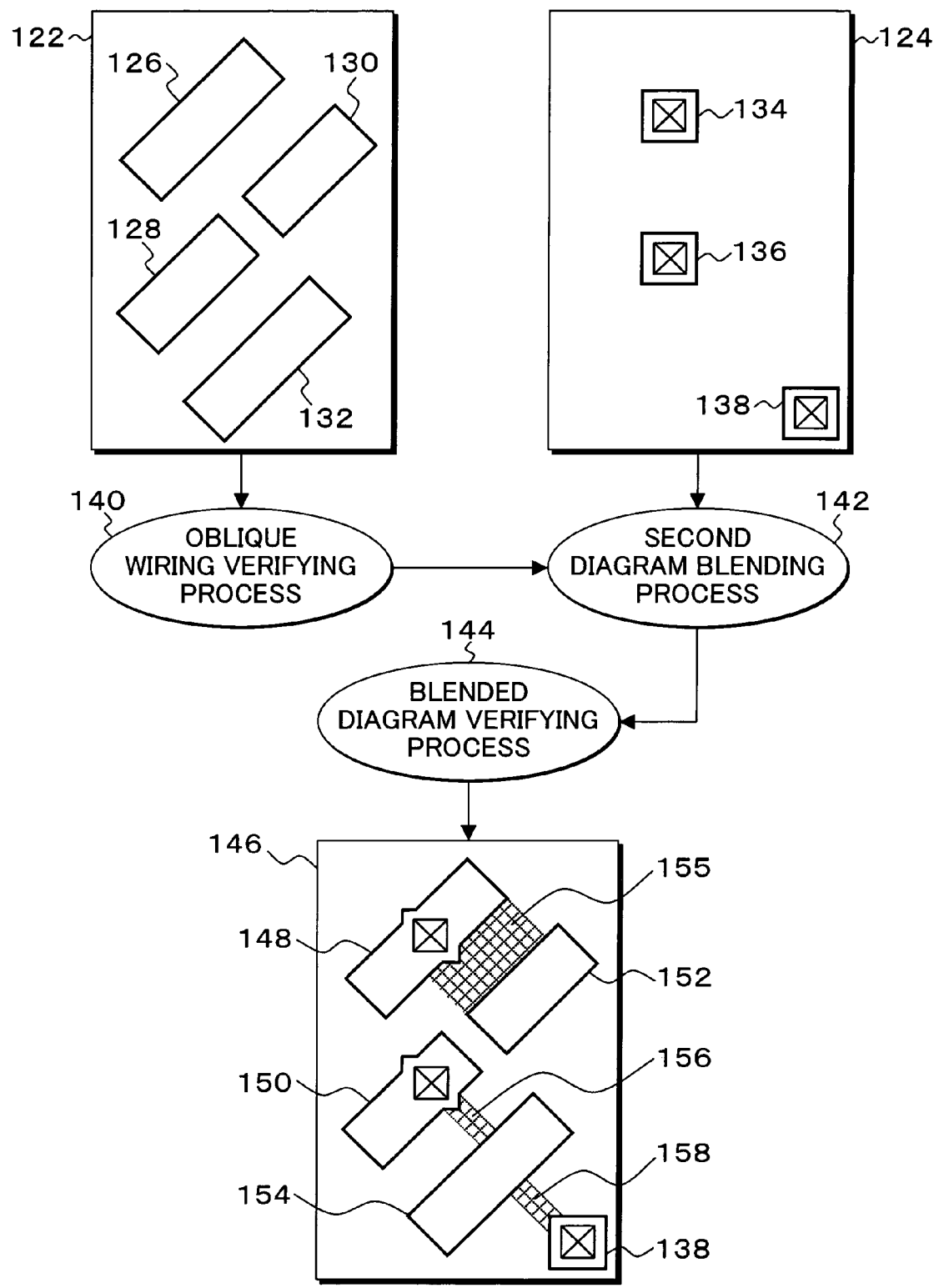
FIG. 18 is an explanatory diagram of the second embodiment of an oblique wiring verifying process according to the invention.

FIG. 18 is an explanatory diagram of the second embodiment of an oblique wiring verifying process according to the invention. The second embodiment is characterized in that with respect to the error data in the verification by the allowable minimum interval value S between the oblique wiring diagrams, the error area by the error layer is adhered to the interval portion in which the error has occurred and also in the case where the error data occurred in the verification using the allowable minimum interval value T regarding the interval between the oblique wiring and the projecting portion by the via cell of the oblique wiring at the time when the oblique wiring and the via cell have been blended, the error area by the error layer is adhered to the interval portion in which the error has occurred.

FIG. 18 shows processes after oblique wiring diagrams and via layer diagrams are obtained with respect to a wiring layer 122 and a via mat layer 124 after completion of the processes in steps S2 and S3 in the design rule check executing process in FIG. 17.

In the wiring layer 122, oblique wirings 126, 128, 130, and 132 are obtained as blended diagrams and the verification by the allowable minimum interval value S is made with respect to them by an oblique wiring verifying process 140.

Subsequently, after the oblique wirings of the wiring layer 122 and the via mat diagrams of the via cells of the via mat layer 124 are blended by a second diagram blending process 142, the verification using the allowable minimum interval value T is made by a blended diagram verifying process 144.

In such verifying processes of two stages as mentioned above, in a mask layer 146, an interval between metal wiring diagrams 148 and 152 violates the allowable minimum interval value S, an error area 155 is adhered by an error layer, further, error data is generated in the verification by the allowable minimum interval value T with respect to an interval between a projecting portion in a metal wiring diagram 150 and a metal wiring diagram 154, and an error area 156 is adhered here by the error layer.

Further, the verification by the allowable minimum interval value T is made also with respect to an interval between the metal wiring diagram 154 and an independent via cell 138. Since the error data is generated also in this portion, an error area 158 is adhered by the error layer.

Figure 19:
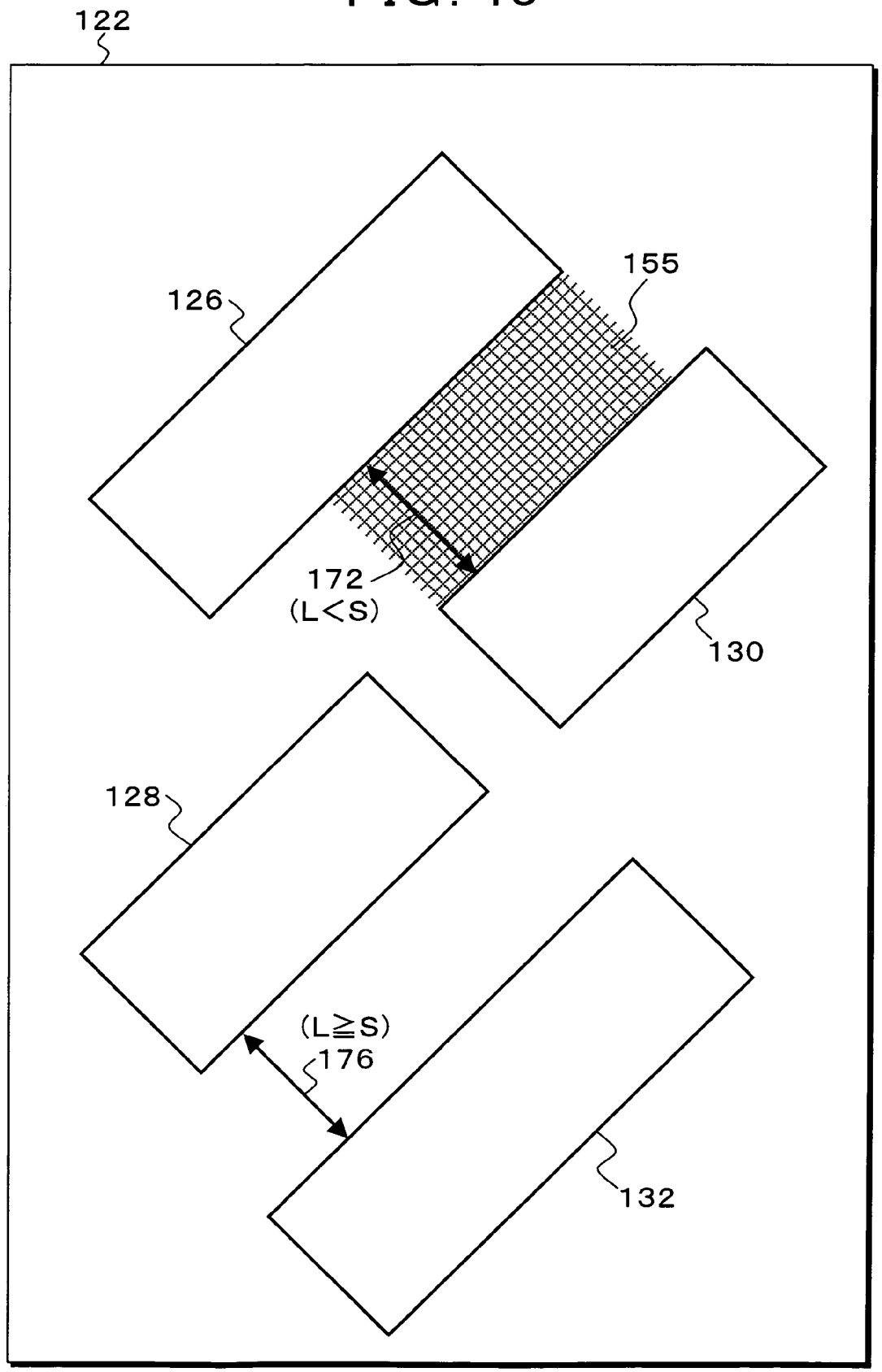
FIG. 19 is an explanatory diagram of an oblique wiring diagram and interval verification of a wiring layer in FIG. 18.

FIG. 19 shows the verifying process by the oblique wiring verifying process 140 in FIG. 18. In the verifying process of the wiring layer 122, the verification using the allowable minimum interval value S between the oblique wirings is made with respect to intervals 172 and 176 between the oblique wirings 126 and 130 and between the oblique wirings 128 and 132, respectively.

If an interval L between the oblique wirings 126 and 130 is less than the allowable minimum interval value S and an error occurs, the error area 155 by the error layer which is separately provided is adhered to the portion of the interval 172 in which the error has occurred.

Figure 20:
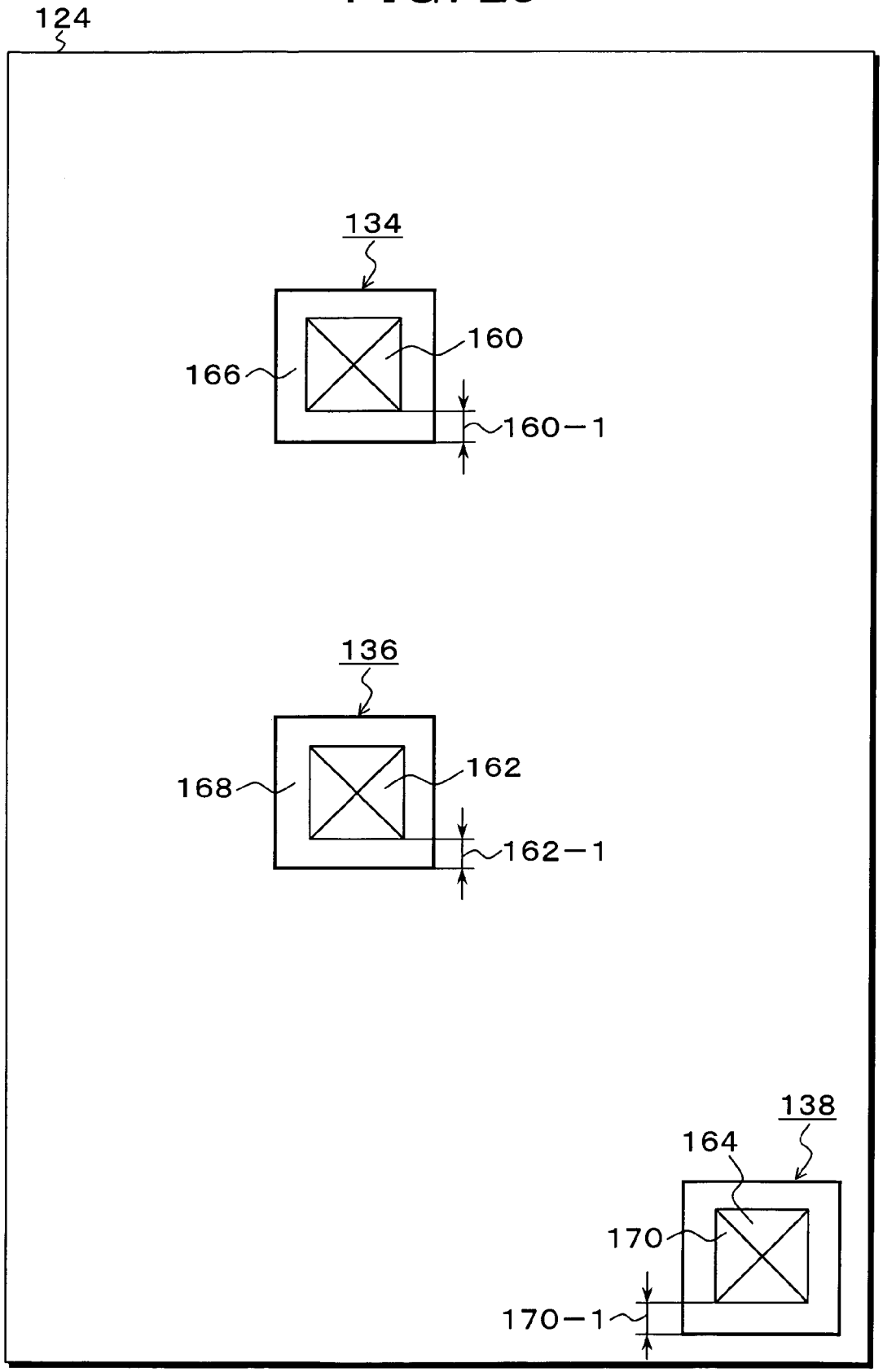
FIG. 20 is an explanatory diagram of a via cell diagram in a via mat layer in FIG. 18.

FIG. 20 shows the via mat layer 124 extracted from FIG. 18. In a manner similar to the case of FIG. 11, via cells 134, 136, and 138 are constructed by vias 160, 162, and 164 and via mats 166, 168, and 170. As wiring overlap values 160-1, 162-1, and 170-1 in the via mats 166, 168, and 170, optimum values which can sufficiently assure the contact areas of the vias to the oblique wirings have been preset.

Figure 21:
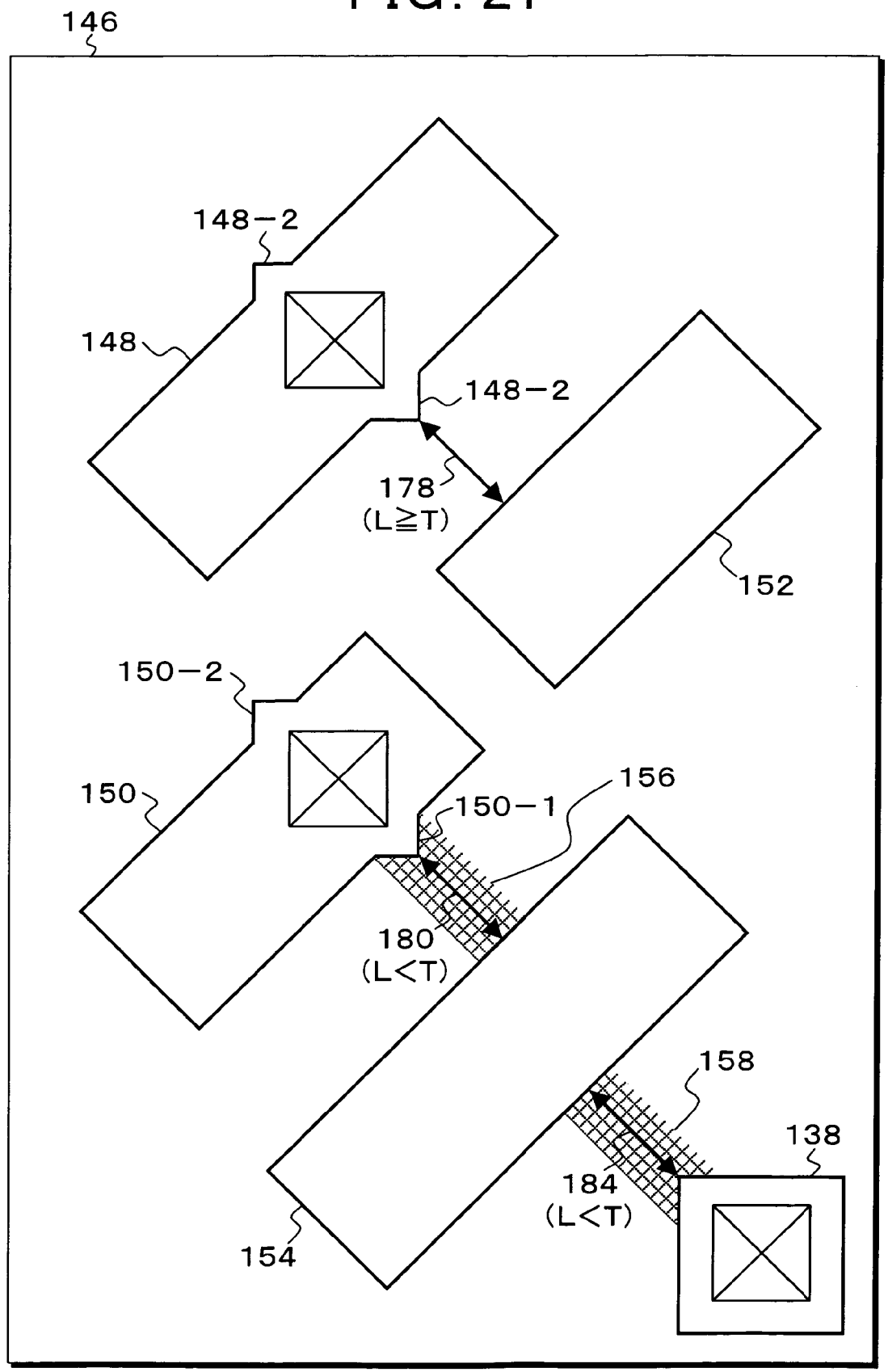
FIG. 21 is an explanatory diagram of a blended oblique wiring mask diagram and interval verification of a wiring layer in FIG. 18.

FIG. 21 shows the mask layer 146 extracted with respect to the blended diagram verifying process 144 in FIG. 18. In this verifying process, with respect to the adjacent metal wiring diagrams 148 and 152 in the mask layer 146, the verification by the allowable minimum interval value T is made with regard to an interval 178 between a projecting portion 148-1 and a line edge which faces it. In this case, since the interval 178 is equal to or larger than the allowable minimum interval value T, no error data is generated.

Similarly, with respect to the adjacent metal wiring diagrams 150 and 154, the verification by the allowable minimum interval value T is made with respect to an interval 180 between a projecting portion 150-1 and a line edge which faces it. Since the interval is smaller than the allowable minimum interval value T, it is determined that the interval violates the design rule and the error area 156 is adhered by the error layer.

Further, the verification by the allowable minimum interval value T is made also with respect to an interval 184 between the metal wiring diagram 154 and the independent via cell 138. In this case, since the interval 184 is smaller than the allowable minimum interval value T, it is determined that the interval violates the design rule and the error area 158 is adhered by the error layer.

Figure 22:
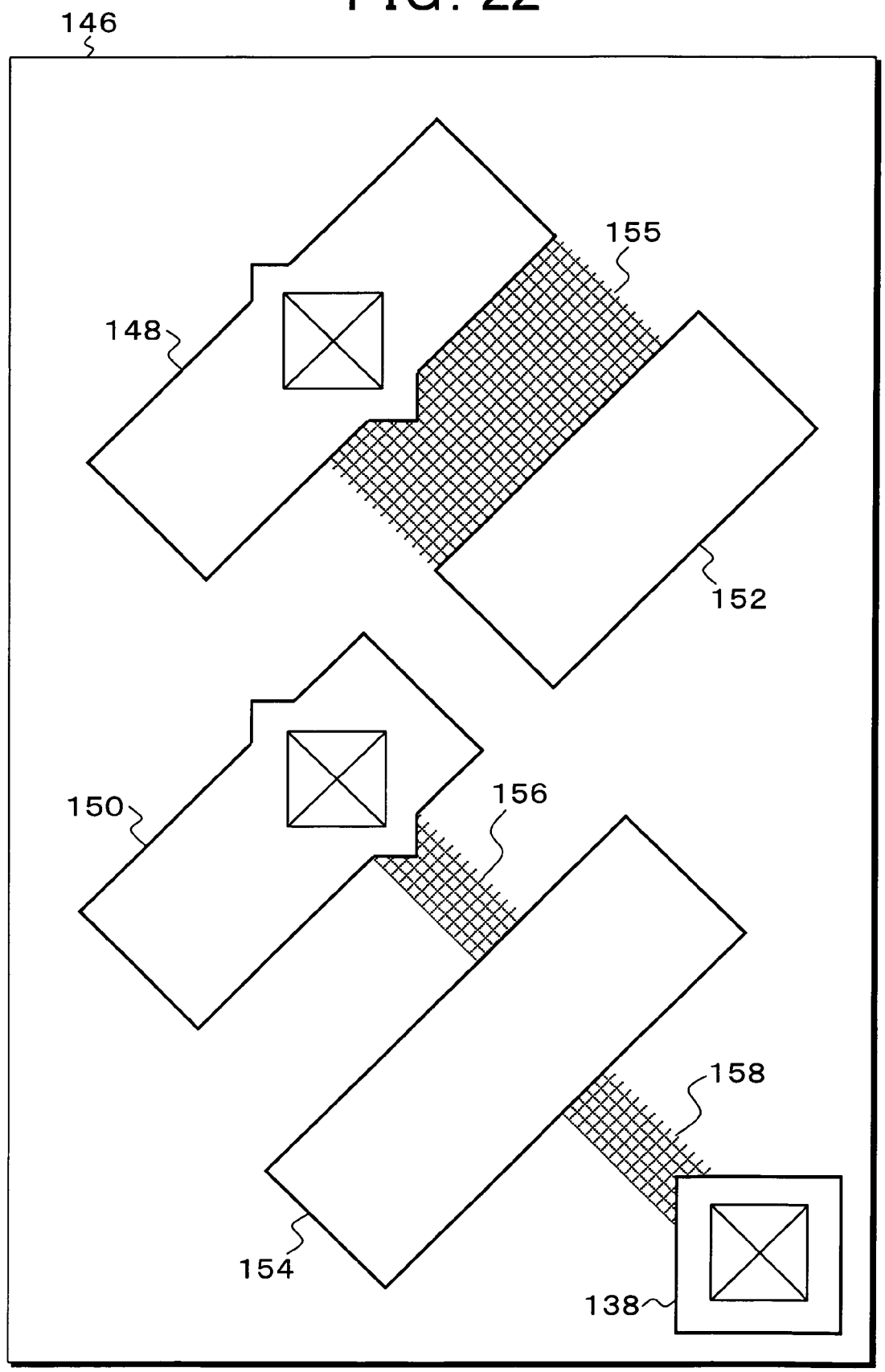
FIG. 22 is an explanatory diagram of an error area painted due to the oblique wiring mask diagram and interval verification in FIG. 18.

FIG. 22 shows the extracted mask layer 146 which is finally obtained by the execution of the design rule check in FIG. 18. The error areas 155, 156, and 158 by the error layer are adhered with respect to the portions where the interval violates the rule and they are displayed on a display screen in the output device. Therefore, the designer can immediately find the violated portions of the intervals from the display of the error areas in the formed wiring diagrams.

Figure 23:
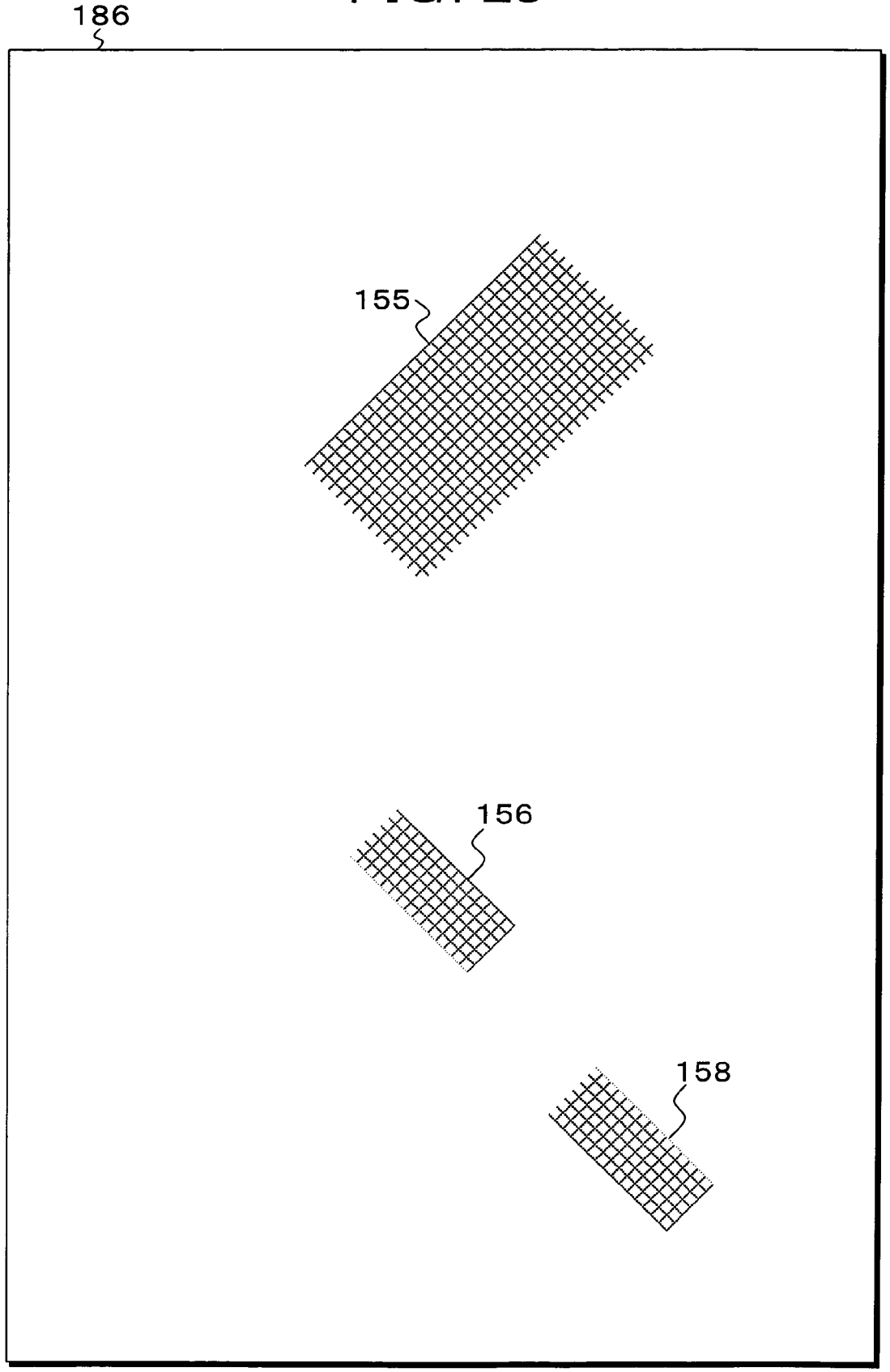
FIG. 23 is an explanatory diagram of an error layer for FIG. 22.

FIG. 23 is an explanatory diagram of an error layer 186 to which the error areas have been adhered to the mask layer 146 in FIG. 22. When the error data is formed by the verification result in the oblique wiring diagrams, the error areas 155, 156, and 158 corresponding to the interval portions where the error has occurred are formed on the error layer 186.

In the foregoing embodiment, for example, as shown in the flowchart of FIG. 17, after the verifying process of the oblique wirings is executed in step S3, the blending process of the oblique wirings and the via mat diagrams of the via cells is executed in step S4 and the verifying process of the blended diagrams is executed in step S5. However, the order of those processes can be reversed. That is, after the blending process of the oblique wirings and the via cells is first executed in step S4, the verification of the blended diagram is made and, thereafter, the verifying process of the oblique wirings can be also executed.

Although the foregoing embodiment has been described with respect to the example of the design of the large scale semiconductor integrated circuit, the invention can be applied to a circuit design of a proper semiconductor integrated circuit irrespective of its scale. Further, the invention can be also applied as it is to a circuit design on a printed circuit board.

The invention incorporates proper modifications without losing its objects and advantages. Further, the invention is not limited by the numerical values shown in the foregoing embodiments.

As described above, according to the invention, with respect to the verification of the allowable minimum interval value between the oblique wirings having the projecting portions due to the blending of the via cells which are formed from the layout data, the allowable minimum interval between the oblique wirings is verified at the stage before the via cells are blended. After the via cells are blended, with respect to the interval between the projecting portion of the via cell and the oblique wiring which is adjacent thereto, by making the verification using the allowable minimum interval value which is smaller than the allowable minimum interval value between the oblique wirings, even in the case of the oblique wirings in which the via cells are blended, the verification of the allowable minimum interval between the oblique wirings can be made without causing the pseudo error due to the projecting portions by the blending of the via cells. Thus, since the oblique wirings can be made to approach up to the minimum distance which is allowed on the basis of the design rule, it is possible to contribute to the saving of a wiring length due to the oblique wirings, the suppression of the wiring delay, and the reduction of the chip area. Since the layout change due to the verifying process can be properly made, it is possible to contribute to the improvement of a yield.

In the invention, merely by forming the oblique wiring diagrams and the via cell diagrams on the different layers, the verification of the small allowable minimum interval between the oblique wirings and the verification of the small allowable minimum interval in the oblique wirings to which the via cells have been blended can be realized. They can be simply and easily realized without adding any special function to the tool of the existing design rule check.

What is claimed is:

1. A computer-aided wiring diagram verifying method of verifying diagram data for a wiring mask including oblique wirings which are formed from layout data of a semiconductor integrated circuit design and via cells which are arranged on the oblique wirings, comprising:
   a layer defining step wherein different layer numbers are defined by a layer defining unit to oblique wiring diagrams and via cell diagrams which are included in the layout data of the semiconductor integrated circuit design;
   a first diagram blending step wherein diagram data including the oblique wiring diagrams and the via cell diagrams is fetched from said layout data and the diagrams are blended every same layer number by a first diagram blending unit;
   an oblique wiring verifying step wherein the oblique wiring diagrams blended in said first diagram blending step are verified by an oblique wiring verifying unit;
   a second diagram blending step wherein said oblique wiring diagrams blended in said first diagram blending step and said via cell diagrams are blended and an oblique wiring mask diagram is formed by a second diagram blending unit; and
   a blended diagram verifying step wherein the oblique wiring mask diagram blended in said second diagram blending step is verified by a blended diagram verifying unit.

2. A method according to claim 1, wherein
in said first diagram blending step, the oblique wiring diagrams are fetched and blended and the via cell diagrams constructed by the via diagrams and via mat diagrams surrounding them are fetched and blended, and
in said second diagram blending step, the oblique wiring diagram blended in said first diagram blending step and the via mat diagram of said via cell diagram are blended in an overlapped portion.

3. A method according to claim 2, wherein in said via mat diagram, a wiring overlap which assures a necessary and sufficient contact area of said via cell diagram and said oblique wiring is formed around the via.

4. A method according to claim 1, wherein in said oblique wiring verifying step, whether an interval between the adjacent oblique wiring diagrams violates an allowable minimum interval value based on a predetermined design rule or not is verified.

5. A method according to claim 1, wherein in said blended diagram verifying step, whether an interval between the oblique wiring diagrams and the via cell diagram blended on the oblique wiring adjacent to said oblique wiring diagram violates a predetermined design rule or not is verified.

6. A method according to claim 5, wherein said oblique wiring diagrams are inclined from horizontal and vertical directions by 45°, said via cell diagram has a rectangular shape exceeding a line width of said oblique wiring, a via cell on the oblique wiring blended in said second diagram blending step has a blended shape such that a corner portion which perpendicularly crosses the oblique wiring direction is projected over the line width of the oblique wiring, and in said blended diagram verifying step, whether an interval between the projecting portion of the oblique wiring due to the blending of the via cells and the oblique wiring diagram adjacent to said projecting portion violates an allowable minimum interval value based on the predetermined design rule or not is verified.

7. A method according to claim 6, wherein in said blended diagram verifying step, if the via cell exists solely adjacent to the oblique wiring, whether an interval between the oblique wiring and a corner edge of said via cell diagram which faces the oblique wiring diagram so as to perpendicularly crosses it violates the allowable minimum interval value based on the predetermined design rule or not is verified.

8. A program for allowing a computer to execute:
   a layer defining step wherein different layer numbers are defined to diagram data of oblique wirings and data of via cell diagrams which are included in layout data of a semiconductor integrated circuit design;
   a first diagram blending step wherein diagram data including the oblique wiring diagrams and the via cell diagrams is fetched from said layout data and the diagrams are blended every same layer number;
   an oblique wiring verifying step wherein the oblique wiring diagrams blended in said first diagram blending step are verified;
   a second diagram blending step wherein the oblique wiring diagram blended in said first diagram blending step and said via cell diagrams are blended, thereby forming an oblique wiring mask diagram; and
   a blended diagram verifying step wherein the oblique wiring mask diagram blended in said second diagram blending step is verified.

9. A program according to claim 8, wherein
in said first diagram blending step, the oblique wiring diagrams are fetched and blended and the via cell diagrams constructed by the via diagrams and via mat diagrams surrounding them are fetched and blended, and
in said second diagram blending step, said oblique wiring diagram blended in said first diagram blending step and the via mat diagram of said via cell diagram are blended in an overlapped portion.

10. A program according to claim 9, wherein in said via mat diagram, a wiring overlap which assures a necessary and sufficient contact area of said via cell diagram and said oblique wiring is formed around the via.

11. A program according to claim 8, wherein in said oblique wiring verifying step, whether an interval between the adjacent oblique wiring diagrams violates an allowable minimum interval value based on a predetermined design rule or not is verified.

12. A program according to claim 8, wherein in said blended diagram verifying step, whether an interval between the oblique wiring diagram and the via cell diagram blended on the oblique wiring adjacent to said oblique wiring diagram violates a predetermined design rule or not is verified.

13. A program according to claim 12, wherein said oblique wiring diagrams are inclined from horizontal and vertical directions by 45°, said via cell diagram has a rectangular shape exceeding a line width of said oblique wiring, a via cell on the oblique wiring blended in said second diagram blending step has a blended shape such that a corner portion which perpendicularly crosses the oblique wiring direction is projected over the line width of the oblique wiring, and in said blended diagram verifying step, whether an interval between the projecting portion of the oblique wiring due to the blending of the via cells and the oblique wiring diagram adjacent to said projecting portion violates an allowable minimum interval value based on the predetermined design rule or not is verified.

14. A program according to claim 13, wherein in said blended diagram verifying step, if the via cell exists solely adjacent to the oblique wiring, whether an interval between the oblique wiring and a corner edge of said via cell diagram which faces the oblique wiring diagram so as to perpendicularly crosses it violates the allowable minimum interval value based on the predetermined design rule or not is verified.

15. A computer-aided wiring diagram verifying apparatus for forming diagram data for a wiring mask including oblique wirings and via cells which are arranged on the oblique wirings from layout data of a semiconductor integrated circuit design, comprising:
  a layer defining unit which defines different layer numbers to oblique wiring diagrams and via cell diagrams which are included in the layout data of the semiconductor integrated circuit design;
  a first diagram blending unit which fetches diagram data including the oblique wiring diagrams and the via cell diagrams from said layout data and blends the diagrams every same layer number;
  an oblique wiring verifying unit which verifies the oblique wiring diagrams blended by said first diagram blending unit;
  a second diagram blending unit which blends the oblique wiring diagram blended by said first diagram blending unit and said via cell diagrams, thereby forming an oblique wiring mask diagram; and
  a blended diagram verifying unit which verifies the oblique wiring mask diagram blended by said second diagram blending unit.

16. An apparatus according to claim 15, wherein
  said first diagram blending unit fetches and blends the oblique wiring diagrams and fetches and blends the via cell diagrams constructed by the via diagrams and via mat diagrams surrounding them, and
  said second diagram blending unit blends said oblique wiring diagram blended by said first diagram blending unit and the via mat diagram of said via cell diagram in an overlapped portion.

17. An apparatus according to claim 16, wherein in said via mat diagram, a wiring overlap which assures a necessary and sufficient contact area of said via cell diagram and said oblique wiring is formed around the via.

18. An apparatus according to claim 15, wherein said oblique wiring verifying unit verifies whether an interval between the adjacent oblique wiring diagrams violates an allowable minimum interval value based on a predetermined design rule or not.

19. An apparatus according to claim 15, wherein said blended diagram verifying unit verifies whether an interval between the oblique wiring diagram and the via cell diagram blended on the oblique wiring adjacent to said oblique wiring diagram violates a predetermined design rule or not.

20. An apparatus according to claim 19, wherein said oblique wiring diagram is inclined from horizontal and vertical directions by 45°, said via cell diagram has a rectangular shape exceeding a line width of said oblique wiring, a via cell on the oblique wiring blended by said second diagram blending unit has a blended shape such that a corner portion which perpendicularly crosses the oblique wiring direction is projected over the line width of the oblique wiring, and said blended diagram verifying unit verifies whether an interval between the projecting portion of the oblique wiring due to the blending of the via cells and the oblique wiring diagram adjacent to said projecting portion violates an allowable minimum interval value based on the predetermined design rule or not.

21. An apparatus according to claim 20, wherein if the via cell exists solely adjacent to the oblique wiring, said blended diagram verifying unit verifies whether an interval between the oblique wiring and a corner edge of said via cell diagram which faces the oblique wiring diagram so as to perpendicularly crosses it violates the allowable minimum interval value based on the predetermined design rule or not.

* * * * *